US008030646B2

(12) United States Patent
Suzuki et al.

(10) Patent No.: US 8,030,646 B2
(45) Date of Patent: Oct. 4, 2011

(54) LIGHT-EMITTING ELEMENT USING ORGANIC COMPOUND

(75) Inventors: Tsunenori Suzuki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 229 days.

(21) Appl. No.: 11/804,747

(22) Filed: May 18, 2007

(65) Prior Publication Data

US 2008/0006821 A1    Jan. 10, 2008

(30) Foreign Application Priority Data

Jun. 2, 2006    (JP) .................................. 2006-155159

(51) Int. Cl.
*H01L 35/24*    (2006.01)
*H01L 51/00*    (2006.01)

(52) U.S. Cl. ............. 257/40; 257/E51.018; 257/E51.022

(58) Field of Classification Search ..................... 257/40, 257/79, 88, 163, 164, 561, 563, 591, E51.018, 257/E51.022
See application file for complete search history.

(56) References Cited

U.S. PATENT DOCUMENTS

| | | | | |
|---|---|---|---|---|
| 6,090,434 | A * | 7/2000 | Sugiura et al. ................... | 427/64 |
| 6,387,546 | B1 | 5/2002 | Hamada et al. | |
| 6,447,934 | B1 | 9/2002 | Suzuki et al. | |
| 6,504,300 | B2 * | 1/2003 | Kawamura et al. .......... | 313/506 |
| 6,670,052 | B2 * | 12/2003 | Hirose et al. ................... | 428/690 |
| 7,622,200 | B2 | 11/2009 | Ohsawa et al. | |
| 2006/0011908 | A1 * | 1/2006 | Ohsawa et al. .................. | 257/40 |
| 2006/0043859 | A1 | 3/2006 | Fukuoka et al. | |
| 2006/0158102 | A1 | 7/2006 | Kawamura et al. | |
| 2006/0267487 | A1 * | 11/2006 | Ozaki et al. .................... | 313/504 |

FOREIGN PATENT DOCUMENTS

| | | |
|---|---|---|
| CN | 1700829 A | 11/2005 |
| EP | 1565041 | 8/2005 |
| JP | 2000-068057 | 3/2000 |
| JP | 2004-221045 | 8/2004 |
| JP | 2006-156888 | 6/2006 |
| WO | WO-2006-059512 | 6/2006 |

OTHER PUBLICATIONS

Goldsmith, C.R. et al., C-H Bond Activation by a Ferric Methoxide Compex: Modeling The Rate-Determining Step in The Mechanism of Lipoxygenase, J.Am.Chem.Soc., vol. 124, No. 1, 2002, pp. 83-96.
Onishi.T et al, "High molecular EL materials-development of light-emitting high molecular compounds," Kyoritsu Shuppan, 2004, pp. 64-67 (with English translation, pp. 1-3).
Office Action re Chinese application No. CN 200710106525.3, dated Nov. 13, 2009 (with English translation).

* cited by examiner

*Primary Examiner* — A. Sefer
*Assistant Examiner* — Dilinh P Nguyen
(74) *Attorney, Agent, or Firm* — Husch Blackwell LLP

(57) ABSTRACT

A light-emitting element is provided, including a first electrode and a second electrode, a first layer including first and second organic compounds, the first layer being formed between the first electrode and the second electrode wherein the first organic compound is capable of emitting a first light and the second organic compound has an electron transporting property, and a second layer including third and fourth organic compounds, the second layer being formed between the first layer and the second electrode wherein the third organic compound is capable of emitting a second light and has an electron trap property and the fourth organic compound has an electron transporting property.

30 Claims, 17 Drawing Sheets

LIGHT-EMITTING ELEMENT USING ORGANIC COMPOUND

BACKGROUND OF THE INVENTION

1. Field of the Invention

The present invention relates to a light-emitting element of a current excitation type. Moreover, the present invention relates to a light-emitting device and an electronic device each having the light-emitting element. In more detail, the present invention relates to a long-life light-emitting device which is superior in color purity. Further, the present invention relates to a long-life light-emitting device and electronic device which are superior in color purity.

2. Description of the Related Art

In recent years, research and development have been extensively conducted on light-emitting elements using electroluminescence. As a basic structure of these light-emitting elements, a layer containing a substance with a light-emitting property is interposed between a pair of electrodes. By application of voltage to this element, light emission from a substance with a light-emitting property can be obtained.

Since such a light-emitting element is a self-luminous type, there are advantages such as higher visibility of a pixel than visibility of a liquid crystal display, and unnecessity of a backlight. Accordingly, such a light-emitting element is considered to be suitable as a flat panel display element. In addition, such a light-emitting element can be manufactured to be thin and light, which is a great advantage. Moreover, the light-emitting element has a feature that response speed is extremely fast.

Furthermore, since such a light-emitting element can be formed into a film form, planar light emission can be easily obtained by formation of a large-area element. This characteristic is difficult to be obtained by a point light source typified by an incandescent lamp or an LED, or a line light source typified by a fluorescent lamp. Therefore, the light-emitting element has a high utility value as a plane light source that can be applied to lighting or the like.

Although the light-emitting elements using electroluminescence are classified roughly in accordance with whether they use an organic compound or an inorganic compound as a substance having a light-emitting property, in the present invention, an organic compound is used for the substance with a light-emitting property.

In that case, by application of voltage to the light-emitting element, electrons and holes are injected from the pair of electrodes into the layer containing an organic compound with a light-emitting property to cause current flow. Then, by recombination of these carriers (electrons and holes), the organic compound with a light-emitting property forms an excited state, and light is emitted when the excited state returns to a ground state. Because of such a mechanism, this kind of light-emitting element is referred to as a light-emitting element of a current excitation type.

It is to be noted that an excited state formed by an organic compound can be a singlet excited state or a triplet excited state. Light emission from the singlet excited state is referred to as fluorescence, and light emission from the triplet excited state is referred to as phosphorescence.

In order to overcome many problems derived from materials of such a light-emitting element and to improve its element characteristics, improvement of an element structure, material development, and so on are carried out.

For example, Patent Document 1 (Patent Document 1: Japanese Published Patent Application No. 2000-068057) discloses a long-life organic EL element in which two light-emitting layers are included to be doped with plural kinds of fluorescent substances having different colors, whereby color stability is secured. However, in Patent Document 1, since doping with plural kinds of fluorescent substances having different colors is performed, light emission with good color purity cannot be obtained, even though white light emission with good color stability can be obtained.

Further, a light-emitting element using an organic compound with a light-emitting property can be driven at lower voltage compared with a light-emitting element using an inorganic compound with a light-emitting property. However, there is a problem that the element has the short life. Accordingly, the light-emitting element is desired to have the longer life.

SUMMARY OF THE INVENTION

Accordingly, it is an object of the present invention to provide a long-life light-emitting element which is superior in color purity, in a case where an organic compound is used for a substance with a light-emitting property. It is another object to provide a long-life light-emitting device and electronic device which are superior in color purity.

As a result of diligent study, the present inventors have found out that the objects can be solved by providing a light-emitting region in the vicinity of the center of the light-emitting layer. That is, the present inventors have found out that the objects can be solved by providing a light-emitting region not at an interface between a light-emitting layer and a hole transporting layer or an interface between a light-emitting layer and an electron transporting layer but in the vicinity of the center of the light-emitting layer in a case where the hole transporting layer and the electron transporting layer exist between both electrodes. Further, the present inventors have found out that the objects can be solved by providing a light-emitting region not at an interface between a light-emitting layer and a hole transporting layer or an interface between a light-emitting layer and an electron transporting layer but in the vicinity of the center of the light-emitting layer also in a case where the hole transporting layer and the electron transporting layer do not exist. The present invention is developed based on expertise described above, and a light-emitting element of the present invention has many modes.

According to a first mode, a light-emitting layer is included between a first electrode and a second electrode, where the light-emitting layer has a first layer and a second layer, the first layer has a first organic compound and a second organic compound, the second layer has a third organic compound and a fourth organic compound, the first layer is provided on a first electrode side of the second layer, the second organic compound has an electron transporting property, the third organic compound has an electron trap property, the fourth organic compound has an electron transporting property, emission color of the first organic compound and emission color of the third organic compound are similar colors, and light emission from the first organic compound is obtained by application of voltage to the first electrode and the second electrode so that a potential of the first electrode is higher than a potential of the second electrode.

According to a second mode, a light-emitting layer is included between a first electrode and a second electrode, where the light-emitting layer has a first layer and a second layer, the first layer has a first organic compound and a second organic compound, the second layer has a third organic compound and a fourth organic compound, the first layer is provided on a first electrode side of the second layer, the second organic compound has an electron transporting property, the third organic compound has a lowest unoccupied molecular orbital level lower than a lowest unoccupied molecular orbital level of the fourth organic compound by 0.3 eV or more, the fourth organic compound has an electron transporting property, emission color of the first organic compound and emission color of the third organic compound are similar colors, and light emission from the first organic compound is obtained by application of voltage to the first electrode and the second electrode so that a potential of the first electrode is higher than a potential of the second electrode.

According to a third mode, a light-emitting layer is included between a first electrode and a second electrode, where the light-emitting layer has a first layer and a second layer, the first layer has a first organic compound and a second organic compound, the second layer has a third organic compound and a fourth organic compound, the first layer is provided on a first electrode side of the second layer, the second organic compound has an electron transporting property, the third organic compound has a lowest unoccupied molecular orbital level lower than a lowest unoccupied molecular orbital level of the fourth organic compound by 0.3 eV or more, the fourth organic compound has an electron transporting property, a difference between a peak value of an emission spectrum of the first organic compound and a peak value of an emission spectrum of the third organic compound is 0 nm or more and less than 30 nm, and light emission from the first organic compound is obtained by application of voltage to the first electrode and the second electrode so that a potential of the first electrode is higher than a potential of the second electrode.

According to a fourth mode, an electron transporting layer and a hole transporting layer are included between a first electrode and a second electrode, where a first layer and a second layer are included between the electron transporting layer and the hole transporting layer, the first layer has a first organic compound and a second organic compound, the second layer has a third organic compound and a fourth organic compound, the first layer is provided on a first electrode side of the second layer, the second organic compound has an electron transporting property, the third organic compound has an electron trap property, the fourth organic compound has an electron transporting property, emission color of the first organic compound and emission color of the third organic compound are similar colors, and light emission from the first organic compound is obtained by application of voltage to the first electrode and the second electrode so that a potential of the first electrode is higher than a potential of the second electrode.

According to a fifth mode, an electron transporting layer and a hole transporting layer are included between a first electrode and a second electrode, where a first layer and a second layer are included between the electron transporting layer and the hole transporting layer, the first layer has a first organic compound and a second organic compound, the second layer has a third organic compound and a fourth organic compound, the first layer is provided on a first electrode side of the second layer, the second organic compound has an electron transporting property, the third organic compound has a lowest unoccupied molecular orbital level lower than a lowest unoccupied molecular orbital level of the fourth organic compound by 0.3 eV or more, the fourth organic compound has an electron transporting property, emission color of the first organic compound and emission color of the third organic compound are similar colors, and light emission from the first organic compound is obtained by application of voltage to the first electrode and the second electrode so that a potential of the first electrode is higher than a potential of the second electrode.

According to a sixth mode, an electron transporting layer and a hole transporting layer are included between a first electrode and a second electrode, where a first layer and a second layer are included between the electron transporting layer and the hole transporting layer, the first layer has a first organic compound and a second organic compound, the second layer has a third organic compound and a fourth organic compound, the first layer is provided on a first electrode side of the second layer, the second organic compound has an electron transporting property, the third organic compound has a lowest unoccupied molecular orbital level lower than a lowest unoccupied molecular orbital level of the fourth organic compound by 0.3 eV or more, the fourth organic compound has an electron transporting property, a difference between a peak value of an emission spectrum of the first organic compound and a peak value of an emission spectrum of the third organic compound is 0 nm or more and less than 30 nm, and light emission from the first organic compound is obtained by application of voltage to the first electrode and the second electrode so that a potential of the first electrode is higher than a potential of the second electrode.

In these many modes of the light-emitting element, the first layer and the second layer are preferably provided to be in contact with each other.

It is to be noted that the present invention includes in its category a light-emitting device having the aforementioned light-emitting element. The light-emitting device in this specification includes an image display device, a light-emitting device, a light source (including a lighting device), or the like. Further, the light-emitting device also includes a module in which a connector such as an FPC (Flexible Printed Circuit), a TAB (Tape Automated Bonding) tape, or a TCP (Tape Carrier Package) is attached to a panel on which the light-emitting element is formed. The light-emitting device in this specification also includes a module in which a printed wiring board is provided at an end of a TAB tape or a TCP, and also includes a module or the like in which an IC (Integrated Circuit) is directly mounted on the light-emitting element by a COG (Chip(lass) method. Further, the light-emitting device in the present invention also includes a case where a light-emitting element includes a control means for controlling light emission of the light-emitting element.

The present invention includes in its category an electronic device as well, in which the light-emitting element of the present invention is used for a display device. Further, another aspect of the present invention is an electronic device including a display device, where the display device is provided with the light-emitting element described above and a control means for controlling light emission of the light-emitting element.

In the light-emitting element of the present invention, a light-emitting region is formed not at an interface between a light-emitting layer and a hole transporting layer or an interface between a light-emitting layer and an electron transporting layer but in the vicinity of the center of the light-emitting layer. Further, a long-life light-emitting element in which an element is not easily deteriorated can be obtained. Also in a case where a hole transporting layer and an electron transporting layer do not exist, the similar effect can be obtained by providing a light-emitting region not at an interface between both electrodes and a light-emitting layer but in the vicinity of the center of the light-emitting layer.

Further, in the light-emitting element of the present invention, emission color of the first organic compound and emission color of the third organic compound are similar colors. Accordingly, light emission with good color purity can be obtained even when not only the first organic compound but also the third organic compound emits light.

Furthermore, by application of the light-emitting element of the present invention to a light-emitting device and an electronic device, a long-life light-emitting device and electronic device which are superior in color purity can be obtained.

DETAILED DESCRIPTION OF THE INVENTION

Figure 1A:
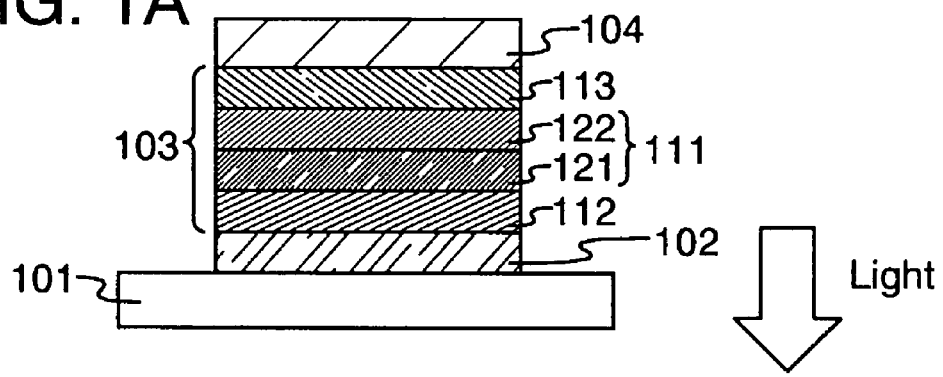
FIGS. 1A to 1C are views illustrating a light-emitting element of the present invention.

Hereinafter, embodiment modes of the present invention will be described in detail with reference to drawings. However, the present invention is not limited to explanation to be given below, and it is to be easily understood that modes and details thereof can be variously modified without departing from the purpose and the scope of the present invention. Therefore, the present invention should not be interpreted as being limited to the description of the embodiment modes to be given below.

It is to be noted that, in the present specification, "composition" refers to not only a state where a plurality of materials are simply mixed but also a state where charges are given and received between materials by the mixture.

Embodiment Mode 1

One mode of a light-emitting element of the present invention will be described with reference to FIG. 1A.

A light-emitting element of the present invention has a plurality of layers between a pair of electrodes. The plurality of layers are a combination of layers formed of a material with a high carrier injecting property and a material with a high carrier transporting property which are stacked so that a light-emitting region is formed in a region away from the electrodes, that is, recombination of carriers is performed in an area away from the electrodes.

In this embodiment mode, a light-emitting element includes a first electrode 102, a second electrode 104, and an EL layer 103 provided between the first electrode 102 and the second electrode 104. It is to be noted that the description will be made below regarding the first electrode 102 as an anode and the second electrode 104 as a cathode. In other words, the description will be made below regarding light emission as being obtained when voltage is applied to the first electrode 102 and the second electrode 104 so that a potential of the first electrode 102 is higher than that of the second electrode 104.

A substrate 101 is used as a base of the light-emitting element. As the substrate 101, glass, plastic, or the like may be used, for example. Other materials than those may be used as long as the materials function as a base in the process of manufacturing the light-emitting element.

As a material used for the first electrode 102, a metal, an alloy, an electroconductive compound, a mixture thereof, or the like with a high work function (specifically, a work function of 4.0 eV or higher is preferable) is preferably used. Specifically, for example, indium oxide-tin oxide (ITO: Indium Tin Oxide), indium oxide-tin oxide containing silicon or silicon oxide, indium oxide-zinc oxide (IZO: Indium Zinc Oxide), indium oxide containing tungsten oxide and zinc oxide (IWZO), and the like are given. Such conductive metal oxide films are usually deposited by sputtering, but may also be formed by using a sol-gel method or the like. For example, indium oxide-zinc oxide (IZO) can be formed by a sputtering method using a target in which zinc oxide of 1 to 20 wt % is added to indium oxide. Indium oxide containing tungsten oxide and zinc oxide (IWZO) can be formed by a sputtering method using a target containing tungsten oxide of 0.5 to 5 wt % and zinc oxide of 0.1 to 1 wt % with respect to indium oxide. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like are given.

The stacked structure of layers in the EL layer 103 is not limited in particular, and may include a layer formed of a substance with a high electron transporting property, a substance with a high hole transporting property, a substance with a high electron injecting property, a substance with a high hole injecting property, a substance with a bipolar property (a substance with a high electron and hole transporting property), or the like and a light-emitting layer to be shown in this embodiment mode to be appropriately combined. For example, the EL layer 103 can be formed by an appropriate combination of a hole injecting layer, a hole transporting layer, a light-emitting layer, an electron transporting layer, an electron injecting layer, and the like. Hereinafter, materials for forming each layer will be specifically described below. As one example, FIGS. 1A to 1C show a structure in which a first electrode 102, a hole transporting layer 112, a light-emitting layer 111, an electron transporting layer 113, and a second electrode 104 are sequentially stacked.

A hole injecting layer may be provided between the first electrode 102 and the hole transporting layer 112. A hole injecting layer is a layer that contains a substance with a high hole injecting property. As the substance with a high hole injecting property, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole injecting layer.

Alternatively, as the hole injecting layer, a composite material of a substance with a high hole transporting property containing an acceptor substance may be used. It is to be noted that, by using the substance with a high hole transporting property containing an acceptor substance, a material used to form an electrode may be selected regardless of its work function. In other words, besides a material with a high work function, a material with a low work function may also be used as the first electrode 102. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron accepting property is high. Among these, molybdenum oxide is especially preferable since it is stable in the air and its hygroscopic property is low so that it can be easily treated.

As a substance with a high transporting property used for the composite material, various compounds such as an aromatic amine compound, carbazole derivatives, aromatic hydrocarbon, and a high molecular compound (such as oligomer, dendrimer, or polymer) can be used. Specifically, a substance having hole mobility of $10^{-6}$ cm$^2$/Vs or higher is preferably used. However, other substances than those may also be used as long as the substances have hole transporting properties higher than electron transporting properties. The organic compounds with high hole transporting properties which can be used for the composite material will be specifically shown below.

For example, the followings can be given as the aromatic amine compound: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivatives that can be used for the composite material, the followings can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); and the like.

Moreover, as the other carbazole derivatives that can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like can also be used.

As the aromatic hydrocarbon that can be used for the composite material, the followings can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. As described above, the aromatic hydrocarbon which has hole mobility of $1 \times 10^{-6}$ cm$^2$/Vs or higher and which has 14 to 42 carbon atoms is particularly preferable.

The aromatic hydrocarbon that can be used for the composite material may have a vinyl skeleton. As such an aromatic hydrocarbon, the followings are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

The hole transporting layer 112 is a layer that contains a substance with a high hole transporting property. As the substance with a high hole transporting property, for example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB) can be used. These substances mainly are substances each having hole mobility of $10^{-6}$ cm$^2$/Ns or higher. However, other substances than these may also be used as long as the hole transporting properties thereof are higher than the electron transporting properties. The layer containing a substance with a high hole transporting property is not limited to a single layer, and two or more layers containing the aforementioned substances may be stacked.

The light-emitting layer 111 is a layer containing a substance with a high light-emitting property. In the light-emitting element of the present invention, the light-emitting layer has a first layer 121 and a second layer 122. The first layer 121 has a first organic compound and a second organic compound, and the second layer 122 has a third organic compound and a fourth organic compound.

The first organic compound included in the first layer 121 is a substance with a high light-emitting property, and various materials can be used. Specifically, as a light-emitting material exhibiting emission of bluish light, N,N'-bis[4-(9H-carbazol-9-yl)phenyl]-N,N'-diphenylstylbene-4,4'-diamine (abbreviation: YGA2S), 4-(9H-carbazol-9-yl)-4'-(10-phenyl-9-anthryl)triphenylamine (abbreviation: YGAPA), and the like are given. As a light-emitting material exhibiting emission of greenish light, N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), and the like are given. As a light-emitting material exhibiting emission of yellowish light, rubrene, 5,12-bis(1,1'-biphenyl-4-yl)-6,11-diphenyltetracene (abbreviation: BPT), and the like are given. As a light-emitting material exhibiting emission of reddish light, N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), and the like are given.

The second organic compound included in the first layer 121 is a substance with a higher electron transporting property than a hole transporting property and a substance by which the substance with a high light-emitting property described above is dispersed. Preferably, the second organic compound is a so-called bipolar material in which the mobility of holes or electrons is 10 times or less than the mobility of the other. Specifically, 9-[4-(10-phenyl-9-anthryl)phenyl]-9H-carbazole (abbreviation: CzPA), tris(8-quinolinolato)aluminum(III) (abbreviation: Alq), 4,4'-(quinoxaline-2,3-diyl) bis(N,N-diphenylaniline) (abbreviation:TPAQn), 9,10-diphenylanthracene (abbreviation: DPAnth), N,N'-(quinoxaline-2,3-diyldi-4,1-phenylene)bis(N-phenyl-1,1'-biphenyl-4-amine) (abbreviation: BPAPQ), 4,4'-(quinoxaline-2,3-diyl)bis{N-[4-(9H-carbazol-9-yl)phenyl]-N-phenylaniline} (abbreviation: YGAPQ), 9,10-diphenylanthracene (abbreviation: DPAnth), and the like are given.

The third organic compound contained in the second layer 122 is an organic compound having a function of trapping electrons. Accordingly, the third organic compound is preferably an organic compound having a lowest unoccupied molecular orbital level (LUMO level) lower than a lowest unoccupied molecular orbital level (LUMO level) of the fourth organic compound contained in the second layer 122 by 0.3 eV or more. The third organic compound may emit light; however, in that case, emission color of the first organic compound and emission color of the third organic compound are preferably similar colors. That is, for example, in a case where the first organic compound exhibits emission of bluish light like YGA2S or YGAPA, the third organic compound is preferably a substance exhibiting emission of blue to blue green light such as acridone, coumarin 102, coumarin 6H, coumarin 480D, or coumarin 30. In a case where the first organic compound exhibits emission of greenish light like 2PCAPA, 2PCABPhA, 2DPAPA, 2DPABPhA, 2YGABPhA, or DPhAPhA, the third organic compound is preferably a substance exhibiting emission of blue green to yellowish green light such as N,N'-dimethylquinacridone (abbreviation: DMQd), N,N'-diphenylquinacridone (abbreviation: DPQd), 9,18-dihydrobenzo[h]benzo[7,8]quino[2,3-b]acridine-7,16-dione (abbreviation: DMNQd-1), 9,18-dimethyl-9,18-dihydrobenzo[h]benzo[7,8]quino[2,3-b]acridine-7,16-dione (abbreviation: DMNQd-2), coumarin 30, coumarin 6, coumarin 545T, coumarin 153, or the like. In a case where the first organic compound exhibits emission of yellowish light like rubrene or BPT, the third organic compound is preferably a substance exhibiting emission of yellowish green to yellowish orange light such as DMQd or (2-{2-[4-(9H-carbazol-9-yl)phenyl]ethenyl}-6-methyl-4H-pyran-4-ylidene)propanedinitrile (abbreviation: DCMCz). In a case where the first organic compound exhibits emission of reddish light like p-mPhTD or p-mPhAFD, the third organic compound is preferably a substance exhibiting emission of orange to red light such as (2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), or Nile red. The above-described compounds are compounds having lower LUMO level among compounds used for a light-emitting element and show a favorable electron trap property by being added to the fourth organic compound to be described below.

Though the description is made as above, as the third organic compound, quinacridone derivatives such as DMQd, DPQd, DMNQd-1, or DMNQd-2 are preferable among the substances enumerated above because quinacridone derivatives are chemically stable. That is, when quinacridone derivatives are applied, the life of a light-emitting element can be especially extended. Further, since quinacridone derivatives exhibits emission of greenish light, the element structure of the light-emitting element of the present invention is especially effective for a light-emitting element exhibiting emission of greenish light. Since green is a color that needs highest luminance than other colors when a full-color display is manufactured, there is a case where the level of deterioration of green is higher than that of other colors. However, it can be improved by the application of the present invention.

The fourth organic compound contained in the second layer 122 is an organic compound with an electron transporting property, that is, a substance with a higher electron transporting property than a hole transporting property. Specifically, tris(8-quinolinolato)aluminum(III) (abbreviation: Alq), bis(8-quinolinolato)zinc(II) (abbreviation: $Znq_2$), bis(2-methyl-8-quinolinolato)(4-phenylphenolato)aluminum (III) (abbreviation: BAlq), bis[2-(2-benzoxazolyl)phenolato] zinc(II) (abbreviation: ZnPBO), bis[2-(2-benzothiazolyl) phenolato]zinc(II) (abbreviation: ZnBTZ), and the like are given. Further, as described above, LUMO level of the third organic compound is preferably lower than LUMO level of the fourth organic compound by 0.3 eV or more. Accordingly, the fourth organic compound may be appropriately selected in accordance with a type of the third organic compound to be used so that such a condition is satisfied. For example, as described below in Embodiment, in a case where DPQd is used as the third organic compound, the above condition is satisfied when Alq is used as the fourth organic compound.

Emission color of the first organic compound and emission color of the third organic compound are preferably similar colors. Accordingly, a difference between a peak value of an emission spectrum of the first organic compound and a peak value of an emission spectrum of the third organic compound is preferably within 30 nm. When the difference is within 30 nm, emission color of the first organic compound and emission color of the third organic compound are similar colors. Accordingly, even in a case where the third organic compound emits light due to change in voltage or the like, change in emission color of the light-emitting element can be suppressed. However, the third organic compound has no necessity to emit light. For example, in a case where emission efficiency of the first organic compound is higher than that of the third organic compound, the concentration of the third organic compound in the second layer 122 is preferably adjusted so that only light emitted from the first organic compound is substantially obtained (the concentration is slightly lowered so that light emission from the third organic compound is suppressed). In this case, emission color of the first organic compound and emission color of the third organic compound are similar colors (that is, the first organic compound and the third organic compound have almost the same energy gap). Accordingly, energy transfer from the first organic compound to the third organic compound does not easily occur, and thus high emission efficiency is obtained.

The electron transporting layer 113 is a layer that contains a substance with a high electron transporting property. For example, the electron transporting layer 113 is a layer containing a metal complex or the like having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum(III) (abbreviation: BAlq). Alternatively, a metal complex or the like having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can also be used. Further alternatively, other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here mainly are substances each having electron mobility of $10^{-6}$ cm$^2$/Vs or higher. The electron transporting layer may be formed of other substances than those described above as long as the substances have higher electron transporting properties than hole transporting properties. Furthermore, the electron transporting layer is not limited to a single layer, and two or more layers made of the aforementioned substances may be stacked.

Further, an electron injecting layer that is a layer containing a substance with a high electron injecting property may be provided between the electron transporting layer 113 and the second electrode 104. As the electron injecting layer, a compound of an alkali metal or an alkaline earth metal such as lithium fluoride (LiF), cesium fluoride (CsF), or calcium fluoride (CaF$_2$) can be used. Further, a layer of a substance with an electron transporting property containing an alkali metal or an alkaline earth metal, such as Alq containing magnesium, may be used. With the use of a layer of a substance with an electron transporting property containing an alkali metal or an alkaline earth metal as the electron injecting layer, electron injection from the second layer 104 is performed efficiently, which is preferable.

As a substance used for the second electrode 104, a metal, an alloy, an electroconductive compound, or a mixture thereof, or the like with a low work function (specifically, a work function of 3.8 eV or lower is preferable) can be used. As a specific example of such a cathode material, an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (magnesium-silver, aluminum-lithium), a rare earth metal such as europium (Eu) or ytterbium (Yb), an alloy containing these, and the like are given. However, by the electron injecting layer being provided between the second electrode 104 and the electron transporting layer, various conductive materials such as aluminum, silver, ITO, or indium oxide-tin oxide containing silicon or silicon oxide can be used as the second electrode 104 regardless of their work function.

Various methods can be used for forming the EL layer 103, regardless of a dry method or a wet method. For example, a vacuum evaporation method, an ink-jet method, a spin coat method, or the like may be used. Furthermore, each electrode or each layer may be formed by a different film deposition formation method.

The light-emitting element of the present invention that has the structure as the above emits light when a current flows due to a potential difference generated between the first electrode 102 and the second electrode 104 and holes and electrons are recombined in the EL layer 103. More specifically, the light-emitting element of the present invention has a structure in which, in the light-emitting layer 111 in the EL layer 103, a light-emitting region is formed in the first layer 121 and in the vicinity of an interface between the first layer 121 and the second layer 122. This principle will be described below.

Figure 1B:
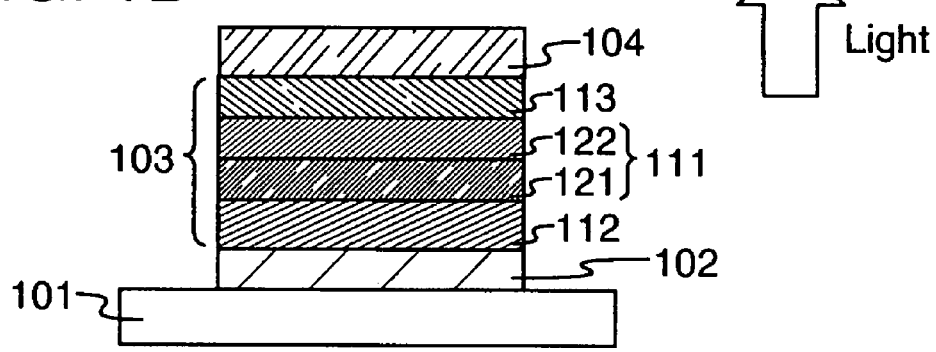
Figure 1C:
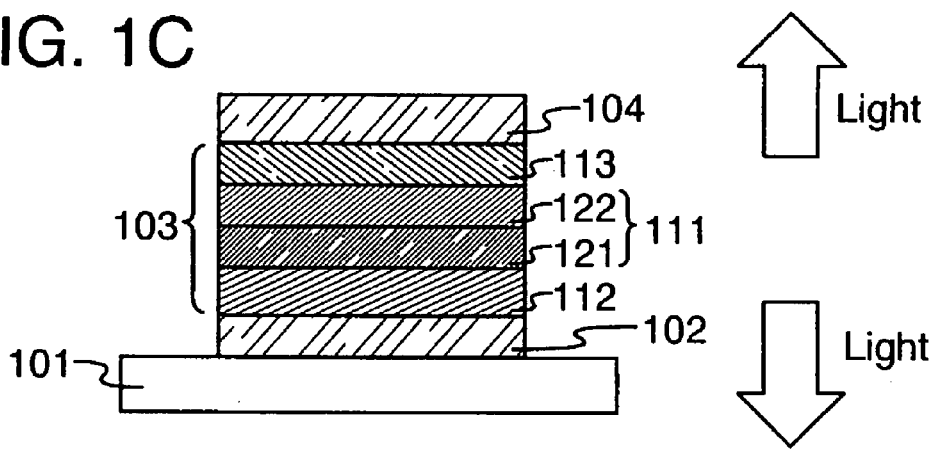
Figure 21:
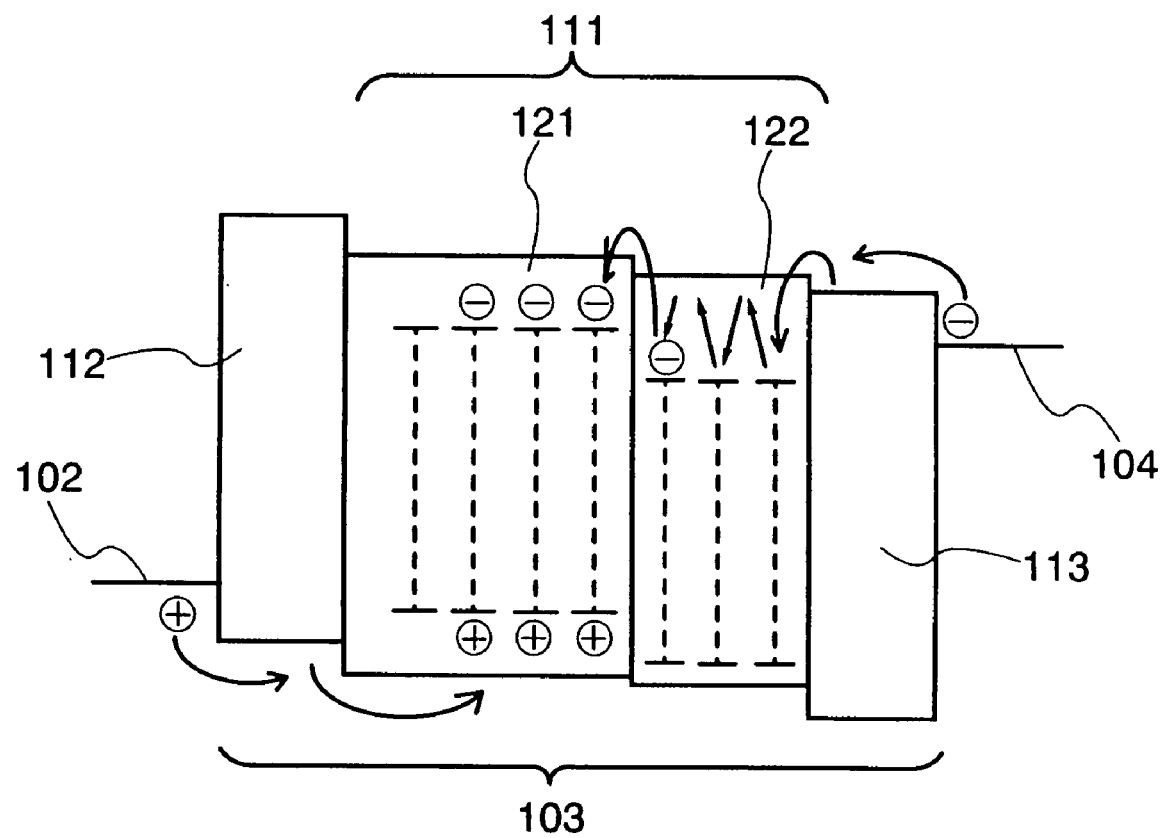
FIG. 21 is a view illustrating a light-emitting element of the present invention.

FIG. 21 is an example of a band diagram of the light-emitting element of the present invention shown in FIGS. 1A to 1C. In FIG. 21, holes injected from the first electrode 102 are injected into the first layer 121 through the hole transporting layer 112. Here, the second organic compound included in the first layer 121 is a substance with a higher electron transporting property than an electron transporting property, and preferably, a so-called bipolar material having a difference in mobility of holes and electrons within 10 times; therefore, holes injected into the first layer 121 is slowly transferred. Accordingly, if a conventional light-emitting element provided with no second layer 122 is used, a light-emitting region is formed in the vicinity of an interface between the hole transporting layer 112 and the first layer 121. In that case, there is a fear that electrons reach the hole transporting layer 112 and deteriorate the hole transporting layer 112. Further, if the amount of electrons reaching the hole transporting layer 112 is increased with time, recombination probability is lowered with time. As a result, luminance degradation with time is caused, leading to the short life of the element.

The light-emitting element of the present invention has a feature that the second layer 122 is further provided in the light-emitting layer 111. Electrons injected from the second electrode 104 are injected into the second layer 122 through the electron transporting layer 113. Here, the second layer 122 has a structure in which the third organic compound having a function of trapping electrons is added to the fourth organic compound with an electron transporting property. Therefore, electrons injected into the second layer 122 are slowly transferred, and thus electron injection into the first layer 121 is controlled. As a result, in the light-emitting element of the present invention, a light-emitting region that is conventionally formed in the vicinity of the interface between the hole transporting layer 112 and the first layer 121 is formed in the first layer 121 and in the vicinity of the interface between the first layer 121 and the second layer 122. Therefore, a possibility that electrons reach the hole transporting layer 112 and deteriorate the hole transporting layer 112 becomes small. Similarly, a possibility that holes reach the electron transporting layer 113 and deteriorate the electron transporting layer 113 is small because the second organic compound in the first layer 121 has an electron transporting property.

Further, in the present invention, it is important that, in the second layer 122, an organic compound having a function of trapping electrons is added to an organic compound with an electron transporting property, rather than simply applying a substance having slow electron mobility as the second layer 122. With such a structure, it is possible not only to control electron injection into the first layer 121, but also to prevent the amount of the controlled electron injection from being changed with time. Further, the amount of holes in the first layer 121 is not easily changed with time as well because the second organic compound in the first layer 121 has an electron transporting property and the first organic compound that is a light-emitting substance is added to the first layer 121. From the above, in the light-emitting element of the present invention, a phenomenon that recombination probability is lowered because carrier balance becomes worse with time in the light-emitting element can be prevented. Accordingly, luminance degradation with time can be suppressed, leading to improvement of the life of the element.

In the above explanation, taking as an example a case where the hole transporting layer 112 and the electron transporting layer 113 exist, the following description is made: a phenomenon that recombination probability is lowered because carrier balance becomes worse with time in the light-emitting element can be prevented by a combination of the first layer and the second layer, specifically, a combination of the second organic compound, the third organic compound, and the fourth organic compound, and as a result, an advantage that luminance degradation with time can be suppressed is exhibited. However, this advantage is exhibited regardless of existence of the hole transporting layer 112 and the electron transporting layer 113, and this can be naturally understood from the above explanation.

The emitted light is extracted outside through one or both of the first electrode 102 and the second electrode 104. Therefore, one or both of the first electrode 102 and the second electrode 104 have a light-transmitting property. When only the first electrode 102 has a light-transmitting property, the emitted light is extracted from the substrate side through the first electrode 102 as shown in FIG. 1A. Meanwhile, when only the second electrode 104 has a light-transmitting property, the emitted light is extracted from the side opposite to the substrate side through the second electrode 104 as shown in FIG. 1B. When each of the first electrode 102 and the second electrode 104 has a light-transmitting property, the emitted light is extracted from both the substrate side and the side opposite to the substrate side through the first electrode 102 and the second electrode 104 as shown in FIG. 1C.

The structure of the layers provided between the first electrode 102 and the second electrode 104 is not limited to the aforementioned one. A structure other than the aforementioned one may also be used as long as a light-emitting region in which holes and electrons are recombined is provided in a portion apart from the first electrode 102 and the second electrode 104 so that quenching caused by the light-emitting region and metal coming close to each other is suppressed, and moreover, as long as the light-emitting layer includes the first layer 121 and the second layer 122.

That is to say, the stacked structure of the EL layer is not particularly limited, and layers containing a substance with a high electron transporting property, a substance with a high hole transporting property, a substance with a high electron injecting property, a substance with a high hole injecting property, a substance with a bipolar property (a substance with a high electron and hole transporting property), and the like may be freely combined with the light-emitting layer of the present invention.

Figure 2:
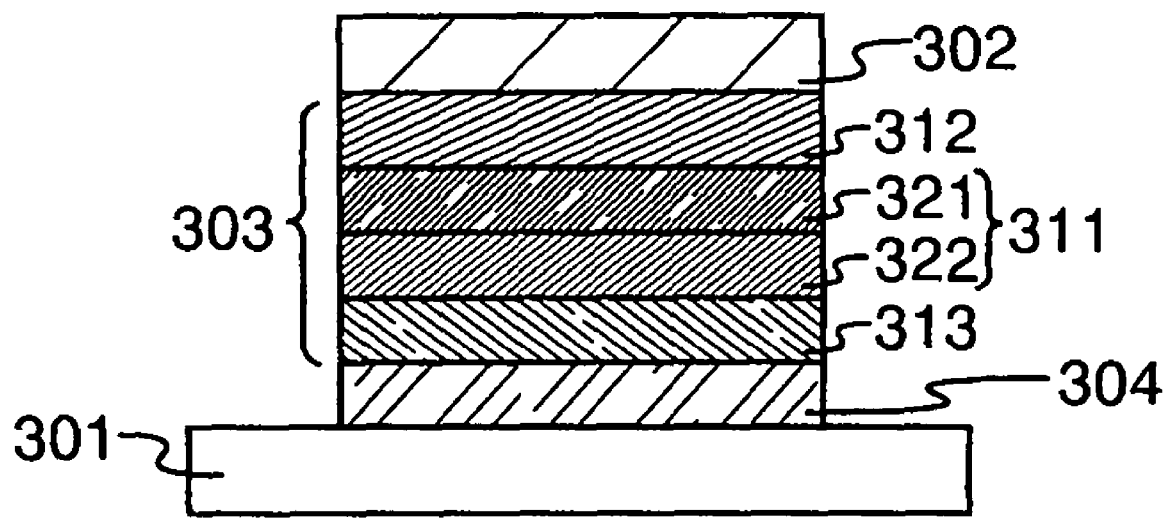
FIG. 2 is a view illustrating a light-emitting element of the present invention.

In a structure of the light-emitting element shown in FIG. 2, over a substrate 301, a second electrode 304 serving as a cathode, an EL layer 303, and a first electrode 302 serving as an anode are sequentially stacked. The EL layer 303 includes a hole transporting layer 312, a light-emitting layer 311, and an electron transporting layer 313. The light-emitting layer 311 has a first layer 321 and a second layer 322. The first layer 321 is provided closer to the side of the first electrode serving as an anode than to the second layer 322.

In this embodiment mode, the light-emitting element is manufactured over a substrate made of glass, plastic, or the like. When a plurality of such light-emitting elements is manufactured over one substrate, a passive type light-emitting device can be manufactured. Moreover, for example, a thin film transistor (TFT) may be formed over a substrate made of glass, plastic, or the like so that a light-emitting element is manufactured over an electrode electrically connected to the TFT. Thus, an active matrix light-emitting device in which driving of the light-emitting element is controlled by the TFT can be manufactured. The structure of the TFT is not particularly limited. The TFT may be either a staggered type or an inverted staggered type. In addition, a driver circuit formed over a TFT substrate may be formed using an N-type and P-type TFTs, or using either an N-type or P-type TFTs. Crystallinity of a semiconductor film used for the TFT is not particularly limited, either. An amorphous semiconductor film may be used, or a crystalline semiconductor film may be used.

In the light-emitting element of the present invention, a light-emitting region is provided not at an interface between a light-emitting layer and a hole transporting layer or an interface between a light-emitting layer and an electron transporting layer but in the vicinity of the center of the light-emitting layer, leading to no influence of deterioration of the hole transporting layer and the electron transporting layer due to the light-emitting region coming close to the hole transporting layer or the electron transporting layer. Further, change in carrier balance with time (especially, change in the amount of electron injection with time) can be suppressed. Thus, a long-life light-emitting element that is not easily deteriorated can be obtained. Because the light-emitting layer of a light-emitting element of the present invention is formed using a compound that is stable even when oxidation-reduction reaction is repeated, the light-emitting element is not easily deteriorated even when light emission by recombination of electrons and holes is repeated, and thus a further long-life light-emitting element can be obtained.

Further, in the light-emitting element of the present invention, emission color of the first organic compound and emission color of the third organic compound are similar colors. Accordingly, light emission with good color purity can be obtained even when not only the first organic compound but also the third organic compound emits light.

This embodiment mode can be arbitrarily combined with other embodiment modes.

Embodiment Mode 2

In this embodiment mode, a mode of a light-emitting element in which a plurality of light-emitting units of the present invention are stacked (hereinafter this light-emitting element is referred to as a stacked-type element) will be described with reference to FIG. 3. The light-emitting element is a stacked-type element including a plurality of light-emitting units between a first electrode and a second electrode. Each of the light-emitting units may have a similar structure to that of the EL layer shown in Embodiment Mode 1. That is, the light-emitting element shown in Embodiment Mode 1 is a light-emitting element having one light-emitting unit, whereas the light-emitting element described in this embodiment mode has a plurality of light-emitting units.

Figure 3:
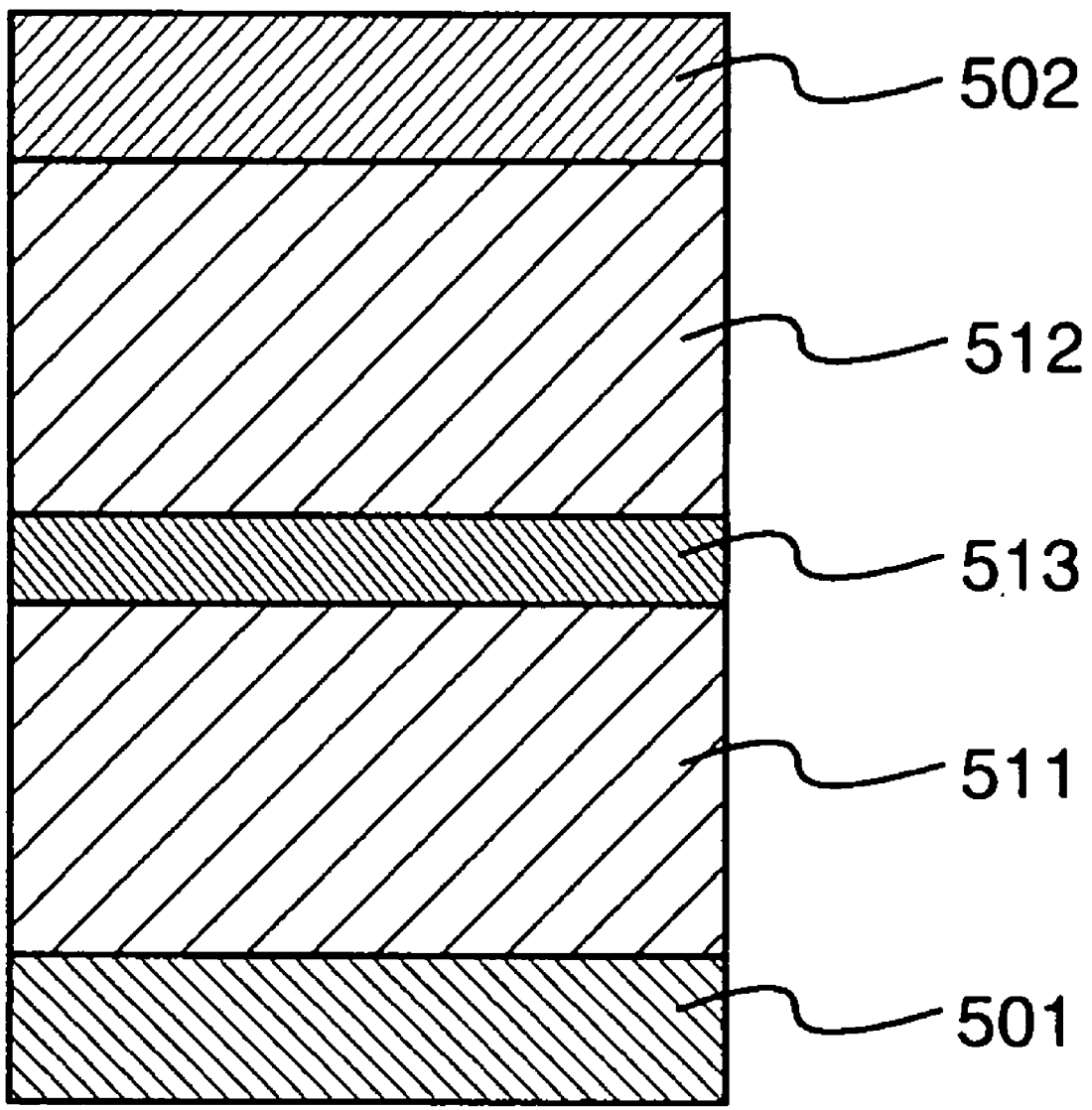
FIG. 3 is a view illustrating a light-emitting element of the present invention.

In FIG. 3, a first light-emitting unit 511 and a second light-emitting unit 512 are stacked between a first electrode 501 and a second electrode 502, and a charge-generating layer 513 is provided between the first light-emitting unit 511 and the second light-emitting unit 512. The first electrode 501 and the second electrode 502 may be similar to the electrodes shown in Embodiment Mode 1. The first light-emitting unit 511 and the second light-emitting unit 512 may have either the same structure or a different structure, which may be similar to those described in Embodiment Mode 1.

The charge-generating layer 513 contains a composite material of an organic compound and a metal oxide. The composite material of an organic compound and a metal oxide is the composite material shown in Embodiment Mode 1 and contains the organic compound and a metal oxide such as vanadium oxide, molybdenum oxide, or tungsten oxide. As the organic compound, various compounds such as an aromatic amine compound, carbazole derivatives, aromatic hydrocarbon, and a high molecular compound (oligomer, dendrimer, polymer, or the like) can be used. As the organic compound, it is preferable to use the organic compound which has a hole transporting property and has hole mobility of $10^{-6}$ cm$^2$/Vs or higher. However, other substances than these may also be used as long as the hole transporting property is higher than the electron transporting property. The composite material of the organic compound and the metal oxide can achieve low-voltage driving and low-current driving because of superior carrier injecting property and carrier transporting property.

Alternatively, the charge-generating layer 513 may be formed by combining a layer containing the composite material of the organic compound and the metal oxide with a layer formed using another material. For example, a layer containing the composite material of the organic compound and the metal oxide may be combined with a layer containing a compound selected from substances with electron-donating properties and a compound with a high electron transporting property. Moreover, a layer containing the composite material of the organic compound and the metal oxide may be combined with a transparent conductive film.

In any case, it is acceptable as long as the charge-generating layer 513 interposed between the first light-emitting unit 511 and the second light-emitting unit 512 injects electrons into one of these light-emitting units and holes to the other when voltage is applied to the first electrode 501 and the second electrode 502. For example, in FIG. 3, it is acceptable as long as the charge-generating layer 513 injects electrons into the first light-emitting unit 511 and holes to the second light-emitting unit 512 in a case where a voltage is applied so that a potential of the first electrode is higher than that of the second electrode.

This embodiment mode describes the light-emitting element having two light-emitting units. However, the present invention can be similarly applied to a light-emitting element in which three or more light-emitting units are stacked. When the charge-generating layer is provided between the pair of electrodes so as to partition the plurality of light-emitting units like the light-emitting element of this embodiment mode, a long-life element in a high luminance region can be realized while keeping current density low. When the light-emitting element is applied for lighting, voltage drop due to resistance of an electrode material can be reduced, thereby achieving homogeneous light emission in a large area. Moreover, a light-emitting device of low power consumption, which can be driven at low voltage, can be realized.

When light-emitting units have different emission colors, light emission of desired color can be obtained as a whole light-emitting element. For example, in the light-emitting element having two light-emitting units, when emission color of the first light-emitting unit and emission color of the third light-emitting unit are complementary colors, a light-emitting element emitting white light as a whole light-emitting element can be obtained. It is to be noted that "complementary color" refers to a relation between colors which become achromatic color by being mixed. That is, white light emission can be obtained by mixture of lights obtained from substances emitting the lights of complementary colors. Similarly, also in a light-emitting element including three light-emitting units, white light emission can be similarly obtained as a whole light-emitting element in a case where emission color of a first light-emitting unit is red, emission color of a second light-emitting unit is green, and emission color of a third light-emitting unit is blue, for example.

This embodiment mode can be arbitrarily combined with other embodiment modes.

Embodiment Mode 3

In this embodiment mode, a light-emitting device including a light-emitting element of the present invention will be described.

Figure 4A:
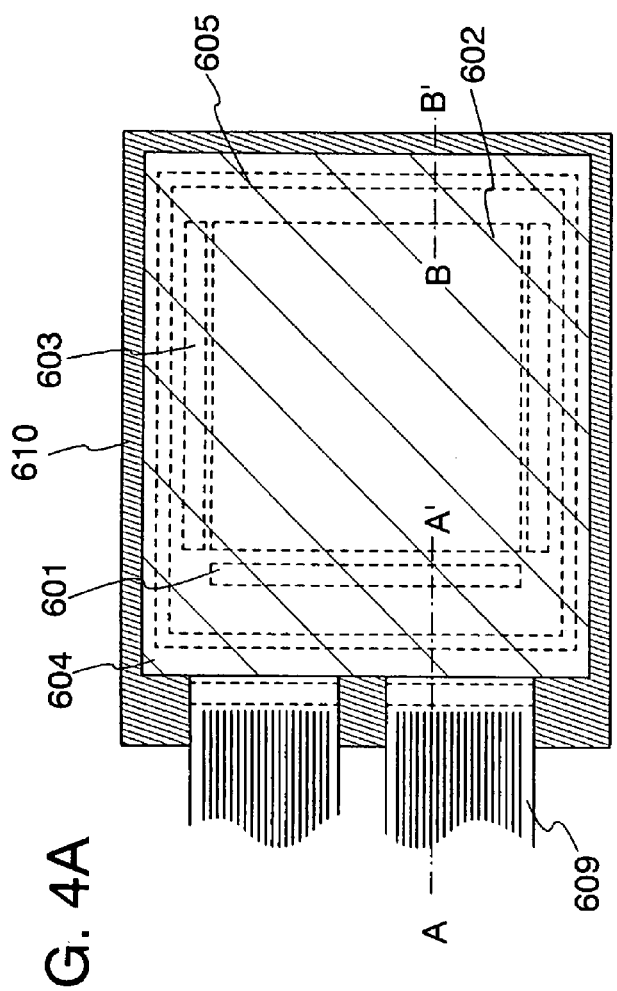
FIGS. 4A and 4B are a top view and a cross-sectional view, respectively, of a light-emitting device of the present invention.
Figure 4B:
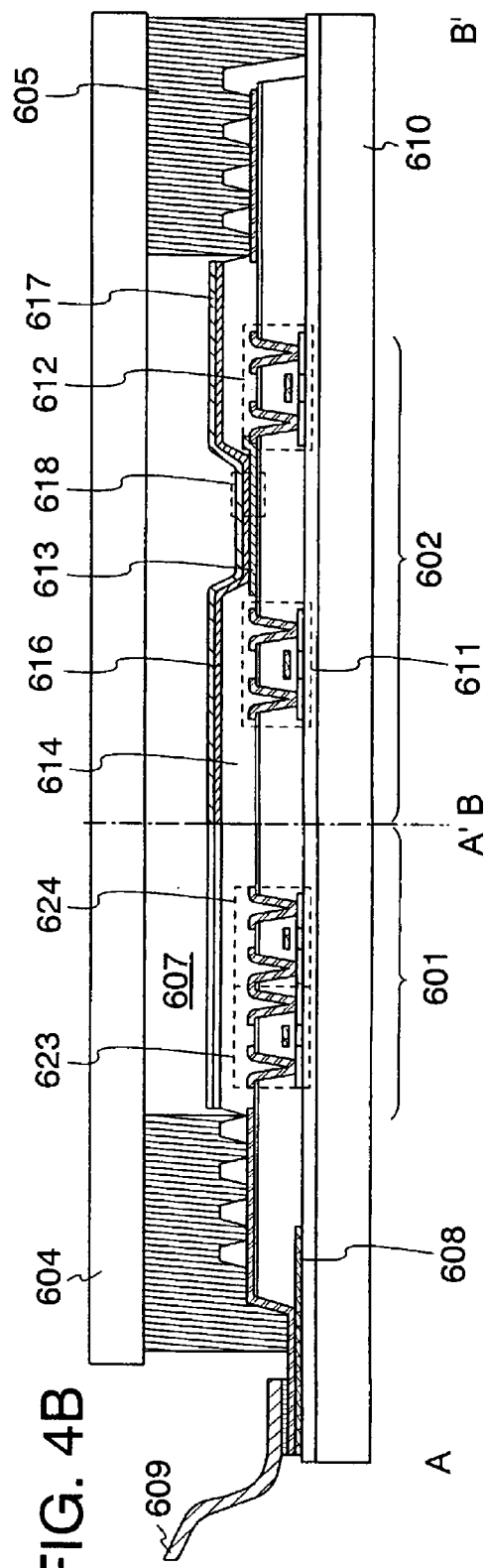

In this embodiment mode, a light-emitting device including a light-emitting element of the present invention in a pixel portion will be described with reference to FIGS. 4A and 4B. FIG. 4A is a top view showing a light-emitting device, and FIG. 4B is a cross-sectional view taken along a line A-A' and a line B-B' in FIG. 4A. Reference numeral 601 denotes a driver circuit portion (source driver circuit), 602 denotes a pixel portion, and 603 denotes a driver circuit portion (gate driver circuit), each of which is shown by a dotted line. Reference numeral 604 denotes a sealing substrate, 605 denotes a sealing member, and 607 denotes a space surrounded by the sealing member 605.

A lead wiring 608 is a wiring for transmitting signals to be input to the source driver circuit 601 and the gate driver circuit 603, and receives a video signal, a clock signal, a start signal, a reset signal, and the like from an FPC (Flexible Printed Circuit) 609 that is an external input terminal. Although only the FPC is shown here, a printed wiring board (PWB) may be attached to the FPC. The light-emitting device in this specification includes not only the light-emitting device itself, but also a state where the FPC or the PWB is attached to the light-emitting device.

Next, a cross-sectional structure will be described with reference to FIG. 4B. Although the driver circuit portions and the pixel portion are formed over an element substrate 610, FIG. 4B shows the source driver circuit 601 that is the driver circuit portion and one pixel in the pixel portion 602.

The source driver circuit 601 includes a CMOS circuit formed by combining an N-channel TFT 623 and a P-channel TFT 624. Alternatively, the driver circuit may be formed using a CMOS circuit, a PMOS circuit, or an NMOS circuit. In this embodiment mode, the integrated driver circuit that is formed over the substrate is shown; however, the driver circuit is not necessarily formed over the substrate and may be formed outside the substrate.

The pixel portion 602 includes a plurality of pixels each having a switching TFT 611, a current controlling TFT 612, and a first electrode 613 that is electrically connected to a drain of the current controlling TFT 612. An insulator 614 is formed to cover an edge portion of the first electrode 613. Here, the insulator 614 is formed using a positive photosensitive acrylic resin film.

In order to improve coverage, an upper edge portion or a lower edge portion of the insulator 614 is formed so as to have a curved surface with curvature. For example, if positive photosensitive acrylic is used for the insulator 614, it is preferable that only the upper edge portion of the insulator 614 have a curved surface with a radius of curvature of 0.2 to 3 µm. Either a negative type which becomes insoluble in an etchant by light irradiation or a positive type which becomes soluble in an etchant by light irradiation can be used as the insulator 614.

An EL layer 616 and a second electrode 617 are formed over the first electrode 613. As a material used for the first electrode 613, various metals, alloys, electroconductive compounds, or a mixture thereof can be used. If the first electrode is used as an anode, it is preferable to use, among those materials, a metal, an alloy, an electroconductive compound, a mixture thereof, or the like with a high work function (work function of 4.0 eV or higher). For example, it is possible to use a single layer film of indium oxide-tin oxide film containing silicon, indium oxide-zinc oxide film, a titanium nitride film, a chromium film, a tungsten film, a zinc film, a platinum film, or the like. It is also possible to use a stacked film such as a stack of a film containing titanium nitride and a film mainly containing aluminum or a three-layer structure of a titanium nitride film, a film mainly containing aluminum, and a titanium nitride film. With the stacked structure, a low wiring resistance, favorable ohmic contact, and a function as an anode can be achieved.

The EL layer 616 is formed by various methods such as an evaporation method using an evaporation mask, an ink-jet method, and a spin coat method. The EL layer 616 includes the light-emitting layer shown in Embodiment Modes 1 and 2. As another material included in the EL layer 616, a low molecular compound or a high molecular compound (including oligomer or dendrimer) may be used. As the material for the EL layer, not only an organic compound but also an inorganic compound may be used.

As a material used for the second electrode 617, various metals, alloys, electroconductive compounds, or a mixture thereof can be used. If the second electrode is used as a cathode, it is preferable to use, among those materials, a metal, an alloy, an electroconductive compound, a mixture thereof, or the like with a low work function (a work function of 3.8 eV or lower). For example, an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (magnesium-silver, aluminum-lithium), or the like can be given. If light generated in the EL layer 616 is transmitted through the second electrode 617, the second electrode 617 can be formed using a stack of a metal thin film and a transparent conductive film (indium oxide-tin oxide (ITO), indium oxide-tin oxide containing silicon or silicon oxide, indium oxide-zinc oxide (IZO), indium oxide containing tungsten oxide and zinc oxide (IWZO), or the like).

When the sealing substrate 604 and the element substrate 610 are attached to each other with the sealing member 605, a light-emitting element 618 is provided in the space 607 surrounded by the element substrate 610, the sealing substrate 604, and the sealing member 605. The space 607 may be filled with filler, and may be filled with an inert gas (such as nitrogen and argon), the sealing member 605, or the like.

An epoxy-based resin is preferably used for the sealing member 605. The material preferably allows as little moisture and oxygen as possible to penetrate. As a material for the sealing substrate 604, a plastic substrate made of FRP (Fiberglass-Reinforced Plastics), PVF (polyvinyl fluoride), polyester, acrylic, or the like can be used besides a glass substrate or a quartz substrate.

In this manner, the light-emitting device including the light-emitting element of the present invention can be obtained.

The light-emitting device of the present invention has the light-emitting element described in Embodiment Modes 1 and 2. Accordingly, by the long-life light-emitting element of the present invention being included, a long-life light-emitting device can be obtained. Further, a light-emitting device which is superior in color purity can be obtained.

Figure 5:
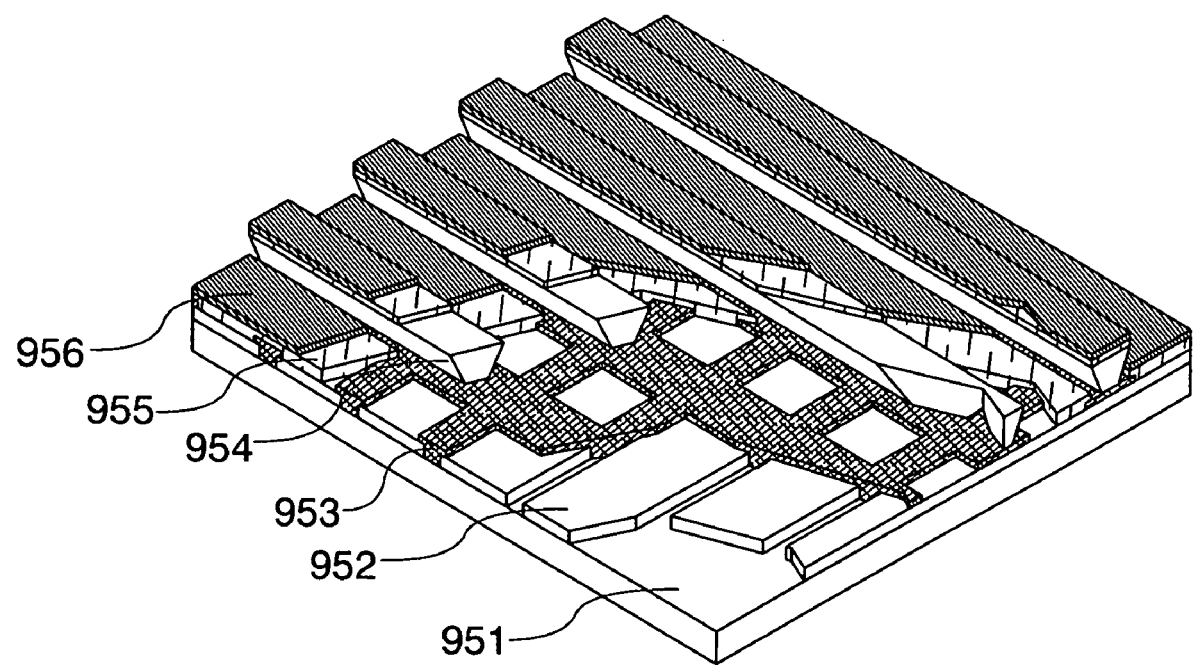
FIG. 5 is a view illustrating a light-emitting device of the present invention.

As described above, in this embodiment mode, an active matrix type light-emitting device in which operation of a light-emitting element is controlled by a transistor is described. Alternatively, a passive matrix type light-emitting device may also be used. FIG. 5 shows a perspective view of a passive matrix type light-emitting device which is manufactured by application of the present invention. In FIG. 5, an EL layer 955 is provided between an electrode 952 and an electrode 956 over a substrate 951. An edge portion of the electrode 952 is covered with an insulating layer 953. Further, a partition layer 954 is provided over the insulating layer 953. A side wall of the partition layer 954 slopes so that a distance between one side wall and the other side wall becomes narrow toward a substrate surface. In other words, a cross section of the partition layer 954 in the direction of a short side is trapezoidal, and a base (a side facing in the same direction as a plane direction of the insulating layer 953 and in contact with the insulating layer 953) is shorter than an upper side (a side facing in the same direction as the plane direction of the insulating layer 953 and not in contact with the insulating layer 953). By the partition layer 954 being provided in this manner, defects of the light-emitting element due to static electricity or the like can be prevented. Also in the passive matrix type light-emitting device, by the long-life light-emitting element of the present invention being included, a long-life light-emitting device can be obtained. Further, a light-emitting device which is superior in color purity can be obtained.

Embodiment Mode 4

In this embodiment mode, an electronic device of the present invention including the light-emitting device described in Embodiment Mode 3 as a part thereof will be described. That is, the electronic device of the present invention includes a long-life display portion having the light-emitting element shown in Embodiment Modes 1 and 2. Further, since the light-emitting element which is superior in color purity is included, a display portion which is superior in color reproductivity can be obtained.

Examples of the electronic device manufactured by using the light-emitting device of the present invention are as follows: a camera such as a video camera or a digital camera, a goggle type display, a navigation system, a sound reproducing device (a car audio system, an audio component, or the like), a computer, a game machine, a portable information terminal (a mobile computer, a mobile phone, a mobile game machine, an electronic book, or the like), an image reproducing device provided with a recording medium (specifically, a device for reproducing a recording medium such as a digital versatile disc (DVD) and having a display device for displaying the image), and the like. FIGS. 6A to 6D show specific examples of these electronic devices.

Figure 6A:
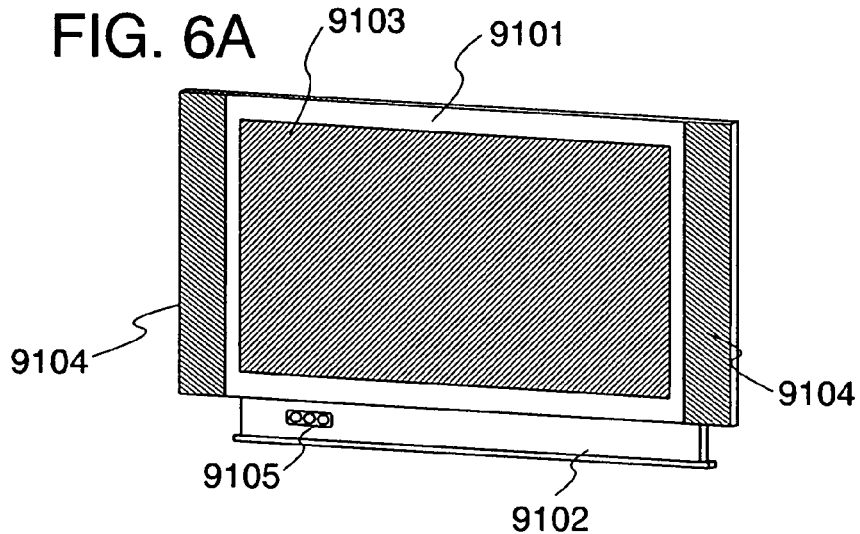
FIGS. 6A to 6D are views illustrating electronic devices of the present invention.

FIG. 6A shows a television device according to the present invention, which includes a chassis 9101, a support base 9102, a display portion 9103, a speaker portion 9104, a video input terminal 9105, and the like. In this television device, the display portion 9103 includes light-emitting elements similar to those described in Embodiment Modes 1 and 2, which are arranged in a matrix. The light-emitting element has a feature that the life is long. Since the display portion 9103 including the light-emitting element also has the similar feature, this television device has a feature that the life is long. That is, a television device that can withstand long-time use can be provided. Further, since a light-emitting element which is superior in color purity is included, a television device having a display portion which is superior in color reproductivity can be obtained.

Figure 6B:
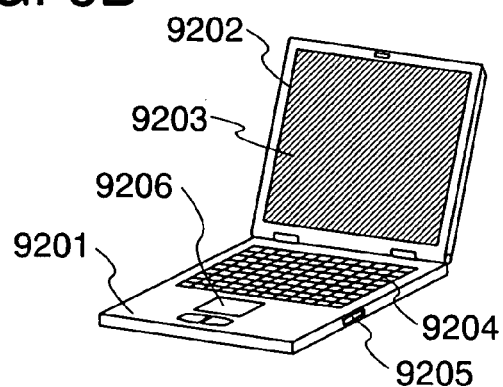

FIG. 6B shows a computer according to the present invention, which includes a main body 9201, a chassis 9202, a display portion 9203, a keyboard 9204, an external connection port 9205, a pointing device 9206, and the like. In this computer, the display portion 9203 includes light-emitting elements similar to those described in Embodiment Modes 1 and 2, which are arranged in a matrix. The light-emitting element has a feature that the life is long. Because the display portion 9203 including the light-emitting element also has the similar feature, this computer has a feature that the life is long. That is, a computer that can withstand long-time use can be provided. Further, because a light-emitting element which is superior in color purity is included, a computer having a display device which is superior in color reproductivity can be obtained.

Figure 6C:
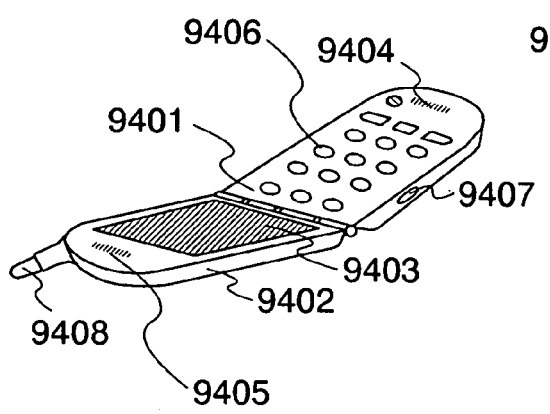

FIG. 6C shows a mobile phone according to the present invention, which includes a main body 9401, a chassis 9402, a display portion 9403, an audio input portion 9404, an audio output portion 9405, an operation key 9406, an external connection port 9407, an antenna 9408, and the like. In this mobile phone, the display portion 9403 includes light-emitting elements similar to those described in Embodiment Modes 1 and 2, which are arranged in a matrix. The light-emitting element has a feature that the life is long. Because the display portion 9403 including the light-emitting element also has the similar feature, this mobile phone has a feature that the life is long. That is, a mobile phone that can withstand long-time use can be provided. Further, because a light-emitting element which is superior in color purity is included, a mobile phone having a display device which is superior in color reproductivity can be obtained.

Figure 6D:
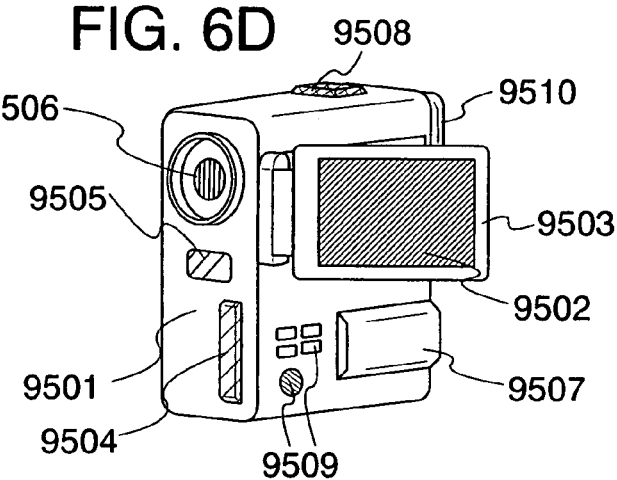

FIG. 6D shows a camera according to the present invention, which includes a main body 9501, a display portion 9502, a chassis 9503, an external connection port 9504, a remote control receiving portion 9505, an image receiving portion 9506, a battery 9507, an audio input portion 9508, an operation key 9509, an eye-piece portion 9510, and the like. In this camera, the display portion 9502 includes light-emitting elements similar to those described in Embodiment Modes 1 and 2, which are arranged in a matrix. The light-emitting element has a feature that the life is long. Because the display portion 9502 including the light-emitting element also has the similar feature, this camera has a feature that the life is long. That is, a camera that can withstand long-time use can be provided. Further, because a light-emitting element which is superior in color purity is included, a camera having a display device which is superior in color reproductivity can be obtained.

As described above, the applicable range of the light-emitting device of the present invention is so wide that the light-emitting device can be applied to electronic devices in various fields. By using the light-emitting device of the present invention, an electronic device having a long-life display portion that can withstand long-time use can be provided. Further, an electronic device having a display portion which is superior in color reproductivity can be obtained.

Alternatively, the light-emitting device of the present invention can also be used as a lighting device. One mode using the light-emitting element of the present invention as a lighting device will be described with reference to FIG. 7.

Figure 7:
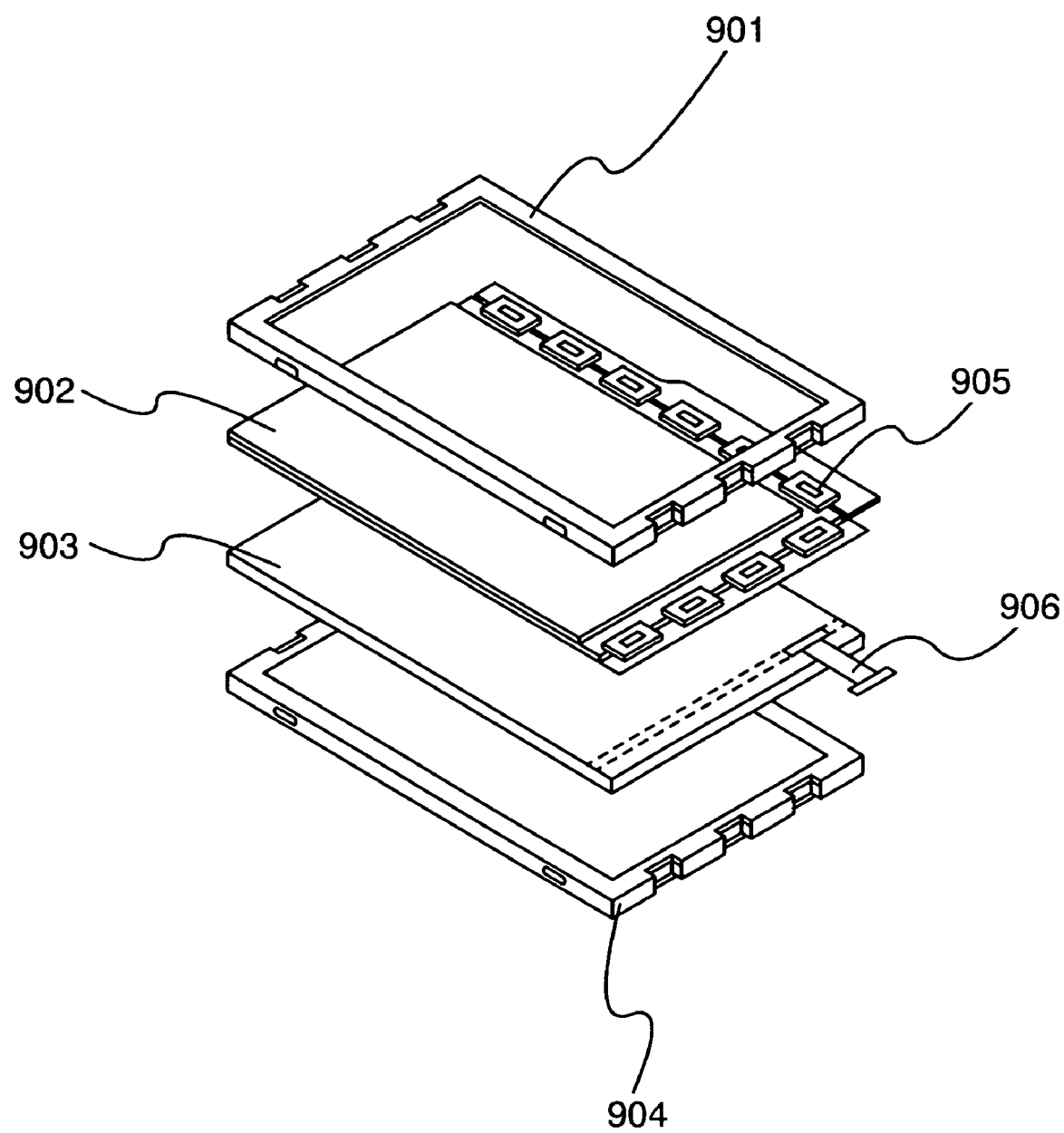
FIG. 7 is a view illustrating an electronic device of the present invention.

FIG. 7 shows an example of a liquid crystal display device using the light-emitting device of the present invention as a backlight. The liquid crystal display device shown in FIG. 7 includes a chassis 901, a liquid crystal layer 902, a backlight 903, and a chassis 904, and the liquid crystal layer 902 is connected to a driver IC 905. The light-emitting device of the present invention is used for the backlight 903, and current is supplied through a terminal 906.

By using the light-emitting device of the present invention as the backlight of the liquid crystal display device, a long-life backlight can be obtained. The light-emitting device of the present invention is a lighting device with planar light emission, and can have a large area. Therefore, the backlight can have a large area, and a liquid crystal display device having a large area can be obtained. Furthermore, the light-emitting device of the present invention is thin and consumes low power; therefore, a thin shape and low power consumption of a display device can also be achieved.

Figure 8:
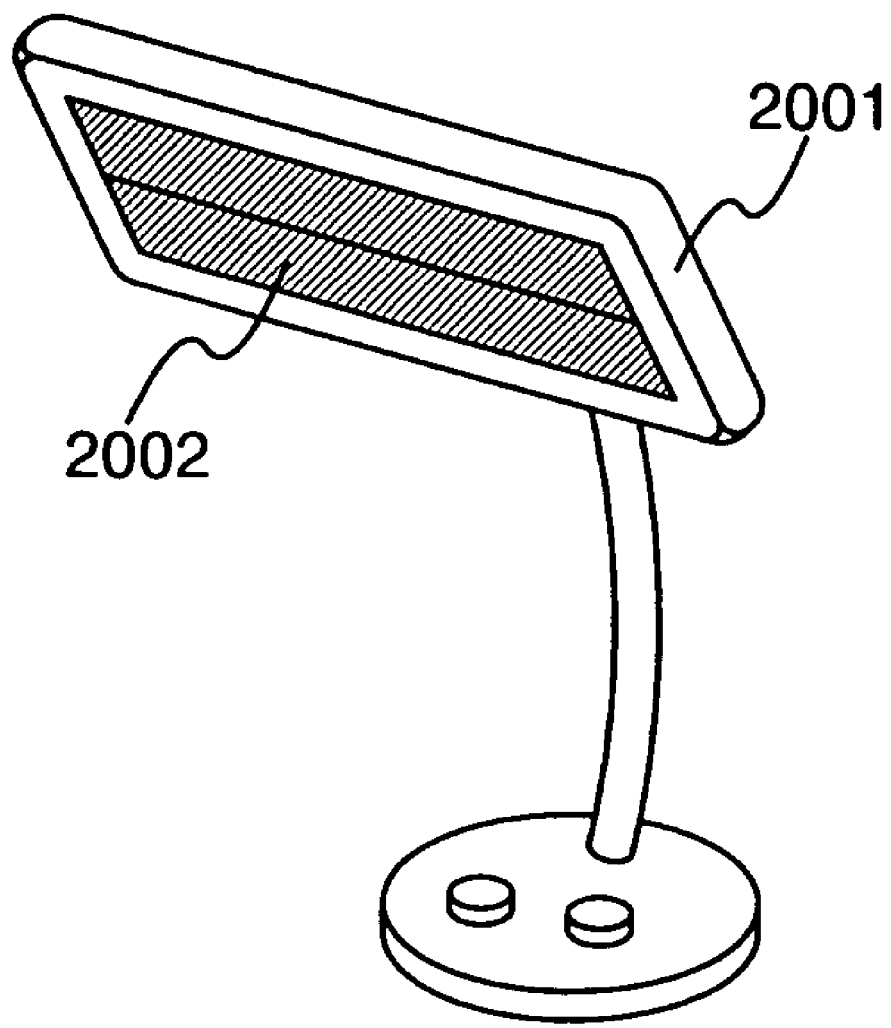
FIG. 8 is a view illustrating a lighting device of the present invention.

FIG. 8 shows an example of using the light-emitting device, to which the present invention is applied, as a table lamp that is a lighting device. A table lamp shown in FIG. 8 has a chassis 2001 and a light source 2002, and the light-emitting device of the present invention is used as the light source 2002. Because the life of the light-emitting device of the present invention is long, the life of the table lamp is also long.

Figure 9:
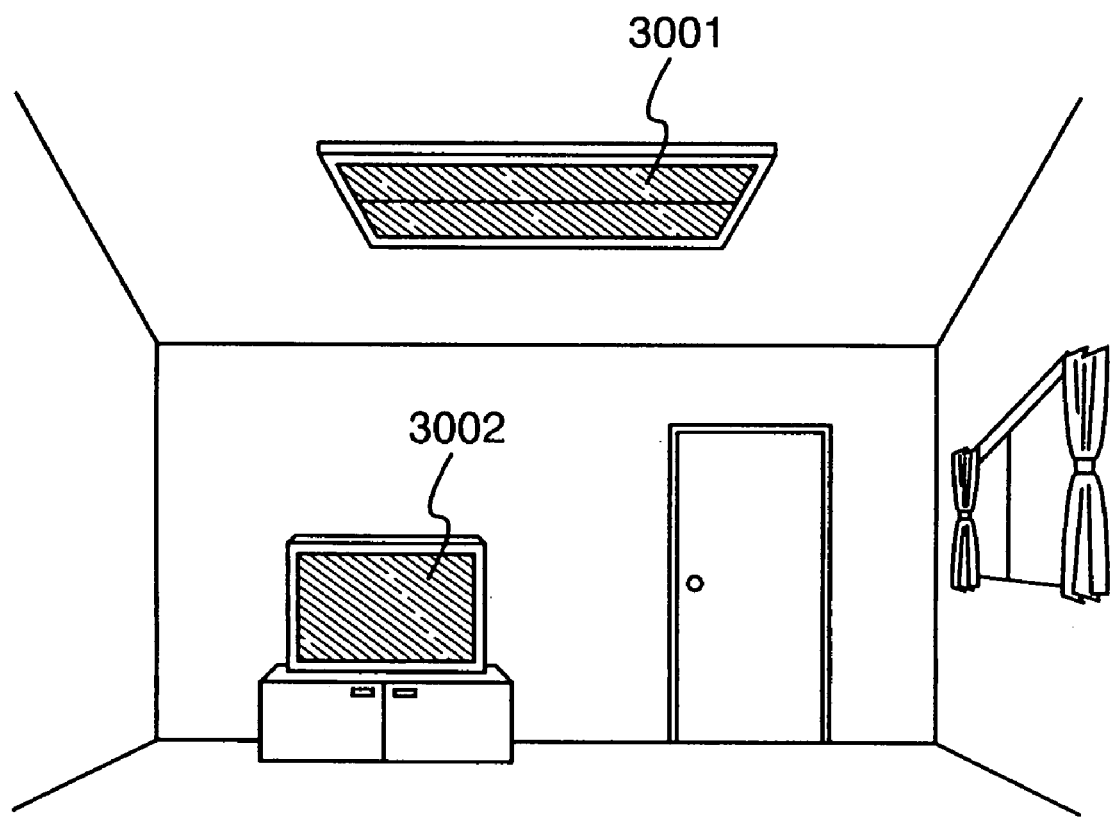
FIG. 9 is a view illustrating a lighting device of the present invention.

FIG. 9 shows an example of using the light-emitting device, to which the present invention is applied, as an indoor lighting device 3001. Since the light-emitting device of the present invention can have a larger area, the light-emitting device of the present invention can be used as a lighting device having a large area. Further, because the life of the light-emitting device of the present invention is long, the light-emitting device of the present invention can be used as a long-life lighting device. A television device 3002 according to the present invention as described in FIG. 6A is placed in a room in which the light-emitting device, to which the present invention is applied, is used as the indoor lighting device 3001. Thus, public broadcasting and movies can be watched. In such a case, since each of the devices has the long life, the number of replacing the lighting device and the television device can be reduced, whereby the environmental load can be reduced.

Embodiment 1

Figure 10:
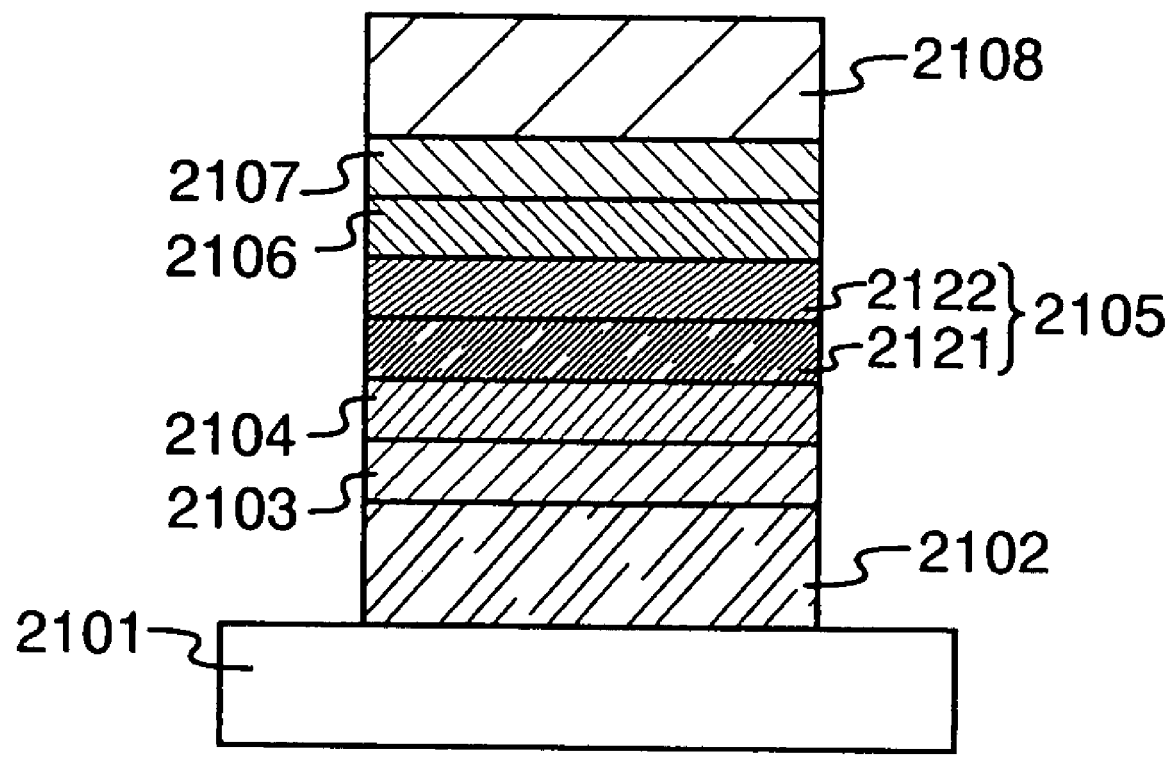
FIG. 10 is a view illustrating a light-emitting element of embodiments.

In this embodiment, a light-emitting element of the present invention will be specifically described with reference to FIG. 10. A structural formula of an organic compound used in this embodiment is shown below.

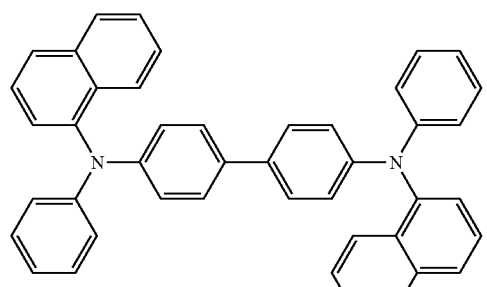

NPB

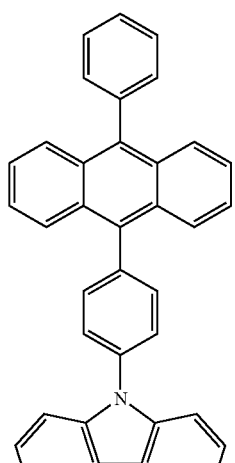

CzPA

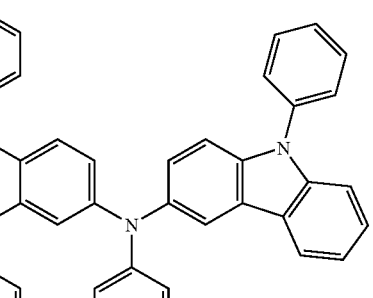

2PCAPA

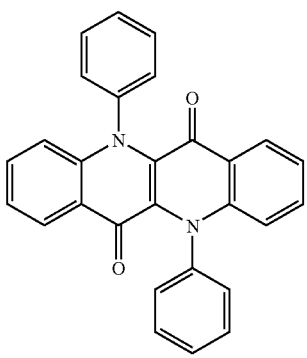

DPQd

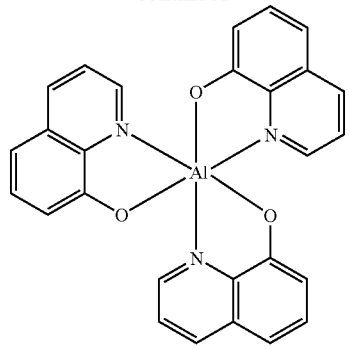

Alq

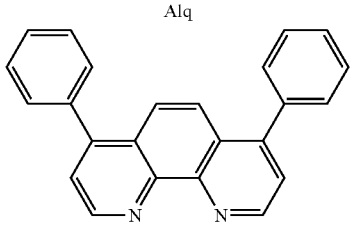

BPhen (Light-Emitting Element 1)

First, indium oxide-tin oxide containing silicon oxide was deposited over a glass substrate 2101 by a sputtering method, leading to the formation of a first electrode 2102. It is to be noted that a thickness thereof was 110 nm and an electrode area was 2 mm×2 mm.

Next, the substrate, over which the first electrode 2102 was formed, was fixed to a substrate holder in a vacuum evaporation apparatus so that the side, on which the first electrode 2102 was formed, faced downward. Subsequently, after the pressure of the vacuum evaporation apparatus was reduced to approximately $10^{-4}$ Pa, a layer 2103 containing a composite material was formed on the first electrode 2102 by co-evaporation of 4,4'-bis[N-(1-napthyl)-N-phenylamino]biphenyl (abbreviation: NPB) and molybdenum oxide (VI). A thickness thereof was adjusted to be 50 nm and a weight ratio of NPB to molybdenum oxide (VI) was adjusted to be 4:1 (=NPB:molybdenum oxide). It is to be noted that the co-evaporation method is an evaporation method in which evaporation is performed simultaneously using a plurality of evaporation sources in one evaporation chamber.

Subsequently, 4,4'-bis[N-(1-napthyl)-N-phenylamino]biphenyl (abbreviation: NPB) was deposited to a thickness of 10 nm by an evaporation method using resistance heating, leading to the formation of a hole transporting layer 2104.

Furthermore, a light-emitting layer 2105 was formed on the hole transporting layer 2104. First, on the hole transporting layer 2104, a first light-emitting layer 2121 was formed to a thickness of 30 nm by co-evaporation of 9-[4-(10-phenyl-9-anthryl)phenyl]-9H-carbazole (abbreviation: CzPA) that is a second organic compound with N-(9,10-diphenyl-2-anthryl)-N,9-diphenyl-9H-carbazole-3-amine (abbreviation: 2PCAPA) that is a first organic compound. Here, a weight ratio of CzPA to 2PCAPA was adjusted to be 1:0.05 (=CzPA: 2PCAPA). Further, on the first light-emitting layer 2121, a second light-emitting layer 2122 was formed to a thickness of 10 nm by co-evaporation of tris(8-quinolinolato)aluminum (III) (abbreviation: Alq) that is a fourth organic compound with N,N'-diphenylquinacridone (abbreviation: DPQd) that is a third organic compound. Here, a weight ratio of Alq to DPQd was adjusted to be 1:0.005 (=Alq:DPQd).

Subsequently, bathophenanthroline (abbreviation: BPhen) was deposited to a thickness of 30 nm on the light-emitting layer 2105 by an evaporation method using resistance heating, leading to the formation of an electron transporting layer 2106, and thereafter lithium fluoride (LiF) was deposited to a thickness of 1 nm on the electron transporting layer 2106, leading to the formation of an electron injecting layer 2107.

Finally, aluminum was deposited to a thickness of 200 nm by an evaporation method using resistance heating, leading to the formation of a second electrode 2108. Accordingly, a light-emitting element 1 was manufactured.

(Comparative Light-Emitting Element 2)

First, indium oxide-tin oxide containing silicon oxide was deposited over a glass substrate by a sputtering method, leading to the formation of a first electrode. It is to be noted that a thickness thereof was 110 nm and an electrode area was 2 mm×2 mm.

Next, the substrate, over which the first electrode was formed, was fixed to a substrate holder in a vacuum evaporation apparatus so that the side, on which the first electrode was formed, faced downward. Subsequently, after the pressure of the vacuum evaporation apparatus was reduced to approximately $10^{-4}$ Pa, a layer containing a composite material was formed on the first electrode by co-evaporation of 4,4'-bis[N-(1-napthyl)-N-phenylamino]biphenyl (abbreviation: NPB) and molybdenum oxide (VI). A thickness thereof was adjusted to be 50 nm and a weight ratio of NPB to molybdenum oxide (VI) was adjusted to be 4:1 (=NPB:molybdenum oxide).

Subsequently, 4,4'-bis[N-(1-napthyl)-N-phenylamino]biphenyl (abbreviation: NPB) was deposited to a thickness of 10 nm by an evaporation method using resistance heating, leading to the formation of a hole transporting layer.

Furthermore, a light-emitting layer was formed on the hole transporting layer. The light-emitting layer was formed to a thickness of 40 nm by co-evaporation of 9-[4-(10-phenyl-9-anthryl)phenyl]-9H-carbazole (abbreviation: CZPA) with N-(9,10-diphenyl-2-anthryl)-N,9-diphenyl-9H-carbazole-3-amine (abbreviation: 2PCAPA). Here, a weight ratio of CzPA to 2PCAPA was adjusted to be 1:0.05 (=CzPA:2PCAPA).

Thereafter, bathophenanthroline (abbreviation: BPhen) was deposited to a thickness of 30 nm on the light-emitting layer by an evaporation method using resistance heating, leading to the formation of an electron transporting layer.

Lithium fluoride (LiF) was deposited to a thickness of 1 nm on the electron transporting layer, leading to the formation of an electron injecting layer.

Finally, aluminum was deposited to a thickness of 200 nm by an evaporation method using resistance heating, leading to the formation of a second electrode. Accordingly, a comparative light-emitting element 2 was manufactured.

Figure 11:
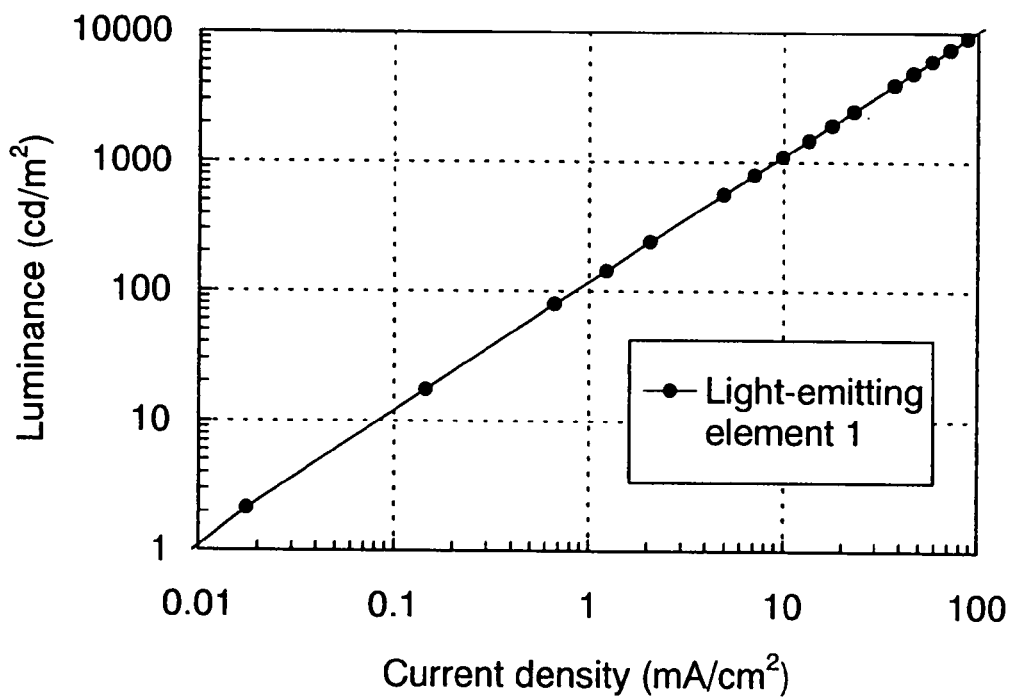
FIG. 11 is a graph showing a current density-luminance characteristic of a light-emitting element manufactured in Embodiment 1.
Figure 12:
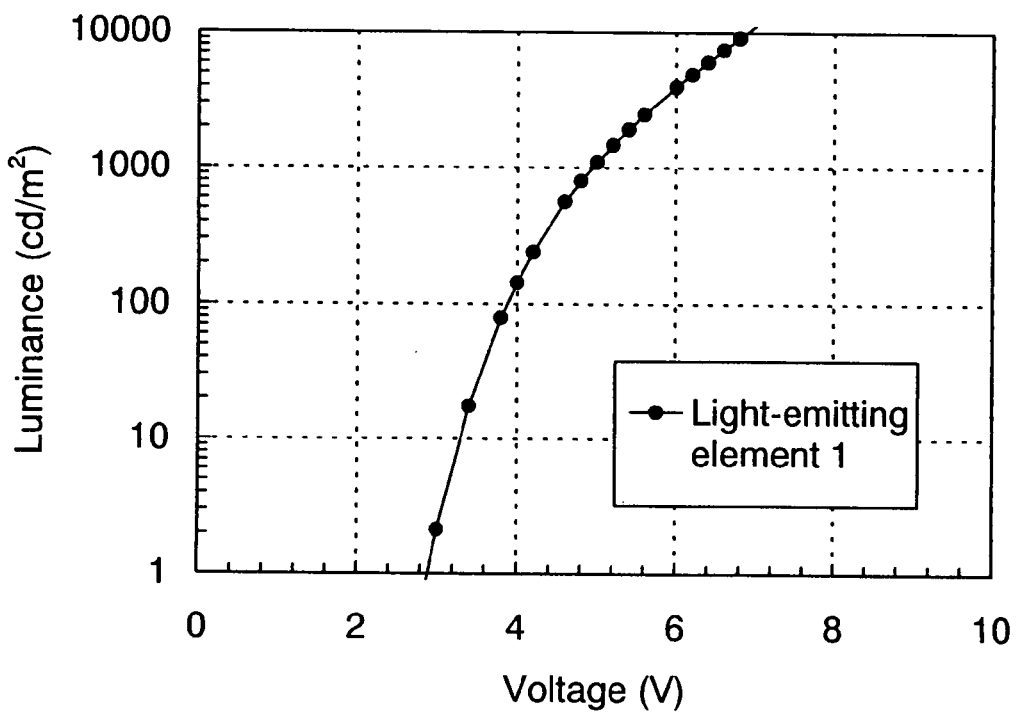
FIG. 12 is a graph showing a voltage-luminance characteristic of a light-emitting element manufactured in Embodiment 1.
Figure 13:
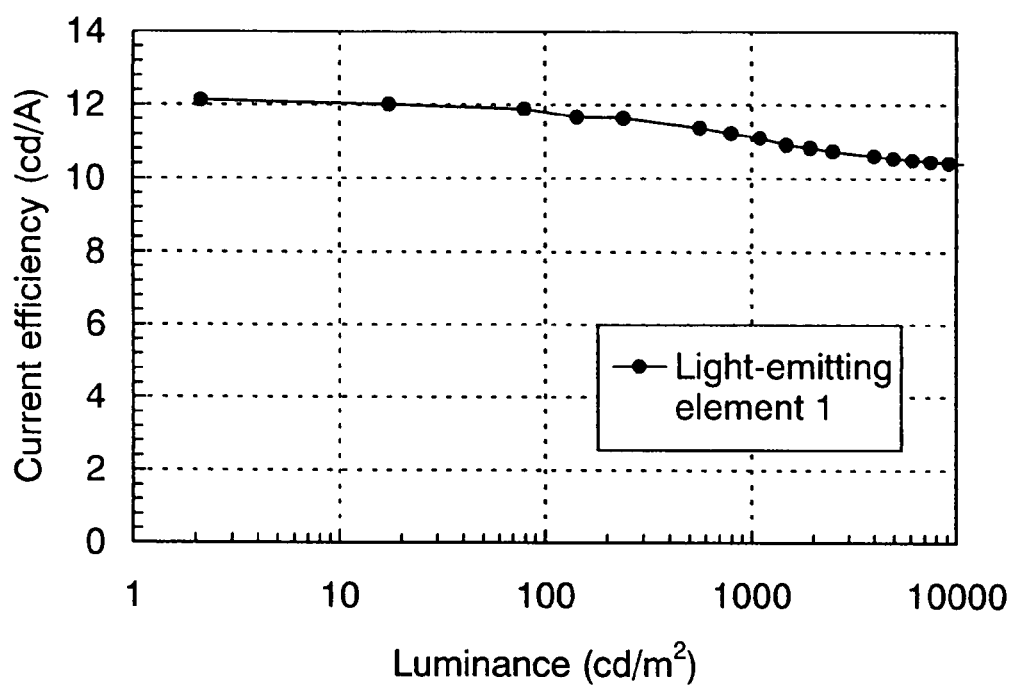
FIG. 13 is a graph showing a luminance-current efficiency characteristic of a light-emitting element manufactured in Embodiment 1.
Figure 14:
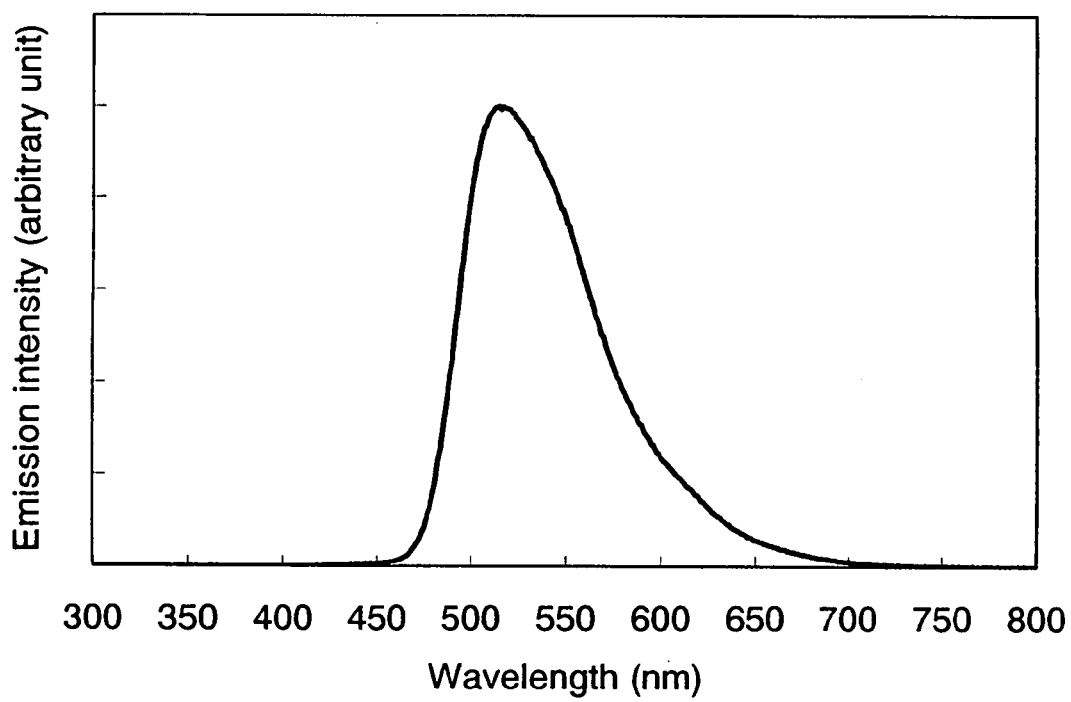
FIG. 14 is a graph showing an emission spectrum of a light-emitting element manufactured in Embodiment 1.

FIG. 11 shows a current density-luminance characteristic of the light-emitting element 1. FIG. 12 shows a voltage-luminance characteristic. FIG. 13 shows a luminance-current efficiency characteristic. FIG. 14 shows an emission spectrum when a current of 1 mA flows to the light-emitting element 1.

In the light-emitting element 1, the CIE chromaticity coordinates at luminance of 3000 cd/m$^2$ were (x, y)=(0.29, 0.62), and emission of green light was obtained. Current efficiency at luminance of 3000 cd/m$^2$ was 10.7 cd/A; voltage, 5.8 V; and current density, 29.4 mA/cm$^2$.

A continuous lighting test was performed on the light-emitting element 1 by constant current driving at an initial luminance of 3000 cd/m$^2$. Through the test, it was found that the light-emitting element 1 is a long-life light-emitting element with luminance of 89% of the initial luminance even after 640 hours have passed. On the other hand, a continuous lighting test was similarly performed on the comparative light-emitting element 2 at an initial luminance of 3000 cd/m$^2$. Through the test, it was found that the comparative light-emitting element 2 has luminance of 76% of the initial luminance after 640 hours have passed, which was the shorter life than that of the light-emitting element 1.

Accordingly, it was revealed that a long-life light-emitting element can be obtained by application of the present invention.

Embodiment 2

In this embodiment, a light-emitting element of the present invention will be specifically described with reference to FIG. 10.

(Light-Emitting Element 3)

First, indium oxide-tin oxide containing silicon oxide was deposited over a glass substrate 2101 by a sputtering method, leading to the formation of a first electrode 2102. It is to be noted that a thickness thereof was 110 nm and an electrode area was 2 mm×2 mm.

Next, the substrate, over which the first electrode 2102 was formed, was fixed to a substrate holder in a vacuum evaporation apparatus so that the side, on which the first electrode 2102 was formed, faced downward. Subsequently, after the pressure of the vacuum evaporation apparatus was reduced to approximately $10^{-4}$ Pa, a layer 2103 containing a composite material was formed on the first electrode 2102 by co-evaporation of 4,4'-bis[N-(1-napthyl)-N-phenylamino]biphenyl (abbreviation: NPB) and molybdenum oxide (VI). A thickness thereof was adjusted to be 50 nm and a weight ratio of NPB to molybdenum oxide (VI) was adjusted to be 4:1 (=NPB:molybdenum oxide).

Next, 4,4'-bis[N-(1-napthyl)-N-phenylamino]biphenyl (abbreviation: NPB) was deposited to a thickness of 10 nm by an evaporation method using resistance heating, leading to the formation of a hole transporting layer 2104.

Furthermore, a light-emitting layer 2105 was formed on the hole transporting layer 2104. First, on the hole transporting layer 2104, a first light-emitting layer 2121 was formed to a thickness of 30 nm by co-evaporation of 9-[4-(10-phenyl-9-anthryl)phenyl]-9H-carbazole (abbreviation: CzPA) that is a second organic compound with N-(9,10-diphenyl-2-anthryl)-N,9-diphenyl-9H-carbazole-3-amine (abbreviation: 2PCAPA) that is a first organic compound. Here, a weight ratio of CzPA to 2PCAPA was adjusted to be 1:0.05 (=CzPA:2PCAPA). Further, on the first light-emitting layer 2121, a second light-emitting layer 2122 was formed to a thickness of 10 nm by co-evaporation of tris(8-quinolinolato)aluminum (III) (abbreviation: Alq) that is a fourth organic compound with N,N'-diphenylquinacridone (abbreviation: DPQd) that is a third organic compound. Here, a weight ratio of Alq to DPQd was adjusted to be 1:0.05 (=Alq:DPQd).

Thereafter, Alq was deposited to a thickness of 30 nm on the light-emitting layer 2105 by an evaporation method using resistance heating, leading to the formation of an electron transporting layer 2106.

Further, lithium fluoride (LiF) was deposited to a thickness of 1 nm on the electron transporting layer 2106, leading to the formation of an electron injecting layer 2107.

Finally, aluminum was deposited to a thickness of 200 nm by an evaporation method using resistance heating, leading to the formation of a second electrode 2108. Accordingly, a light-emitting element 3 was manufactured.

(Comparative Light-Emitting Element 4)

First, indium oxide-tin oxide containing silicon oxide was deposited over a glass substrate by a sputtering method, leading to the formation of a first electrode. It is to be noted that a thickness thereof was 110 nm and an electrode area was 2 mm×2 mm.

Subsequently, the substrate, over which the first electrode was formed, was fixed to a substrate holder in a vacuum evaporation apparatus so that the side, on which the first electrode was formed, faced downward. Subsequently, after the pressure of the vacuum evaporation apparatus was reduced to approximately $10^{-4}$ Pa, a layer containing a composite material was formed on the first electrode by co-evaporation of 4,4'-bis[N-(1-napthyl)-N-phenylamino]biphenyl (abbreviation: NPB) and molybdenum oxide (VI). A thickness thereof was adjusted to be 50 nm and a weight ratio of NPB to molybdenum oxide (VI) was adjusted to be 4:1 (=NPB:molybdenum oxide).

Next, 4,4'-bis[N-(1-napthyl)-N-phenylamino]biphenyl (abbreviation: NPB) was deposited to a thickness of 10 nm by an evaporation method using resistance heating, leading to the formation of a hole transporting layer.

Thereafter, a light-emitting layer was formed on the hole transporting layer. The light-emitting layer was formed to a thickness of 40 nm by co-evaporation of 9-[4-(10-phenyl-9-anthryl)phenyl]-9H-carbazole (abbreviation: CzPA) with N-(9,10-diphenyl-2-anthryl)-N,9-diphenyl-9H-carbazole-3-amine (abbreviation: 2PCAPA). Here, a weight ratio of CzPA to 2PCAPA was adjusted to be 1:0.05 (=CzPA:2PCAPA).

Thereafter, Alq was deposited to a thickness of 30 nm on the light-emitting layer by an evaporation method using resistance heating, leading to the formation of an electron transporting layer.

Further, lithium fluoride (LiF) was deposited to a thickness of 1 nm on the electron transporting layer, leading to the formation of an electron injecting layer.

Finally, aluminum was deposited to a thickness of 200 nm by an evaporation method using resistance heating, leading to the formation of a second electrode. Accordingly, a comparative light-emitting element 4 was manufactured.

Figure 15:
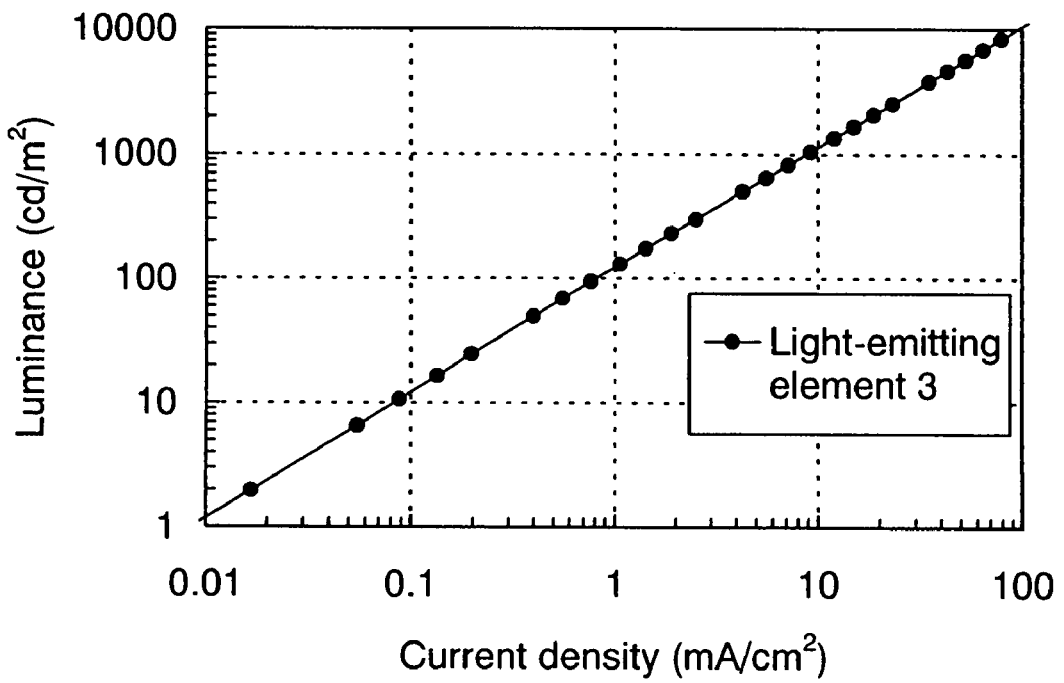
FIG. 15 is a graph showing a current density-luminance characteristic of a light-emitting element manufactured in Embodiment 2.
Figure 16:
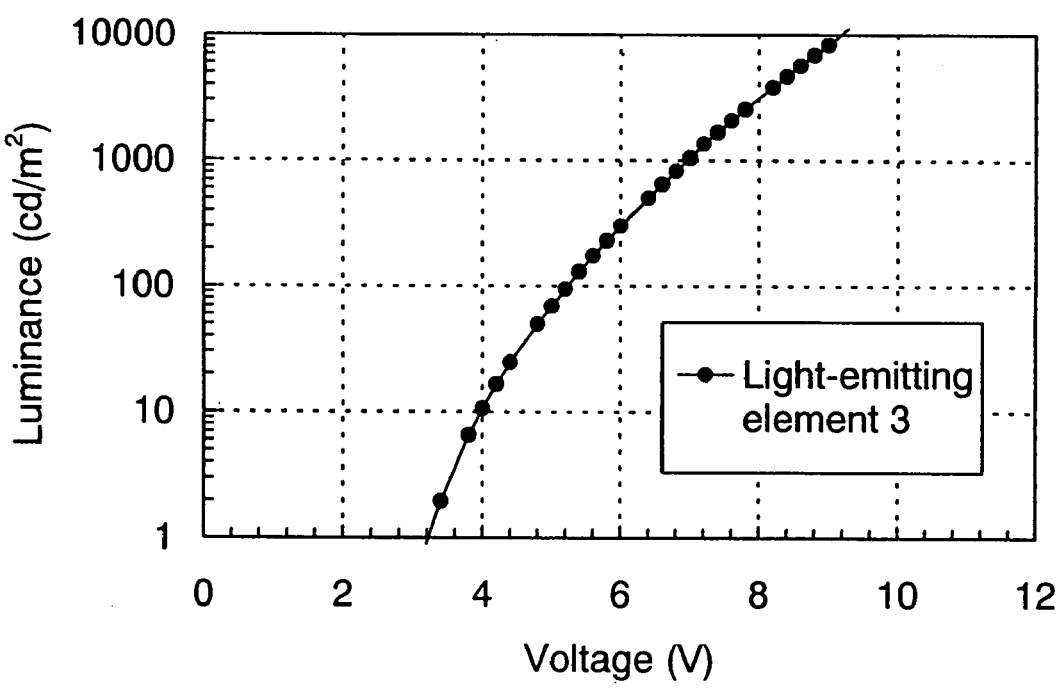
FIG. 16 is a graph showing a voltage-luminance characteristic of a light-emitting element manufactured in Embodiment 2.
Figure 17:
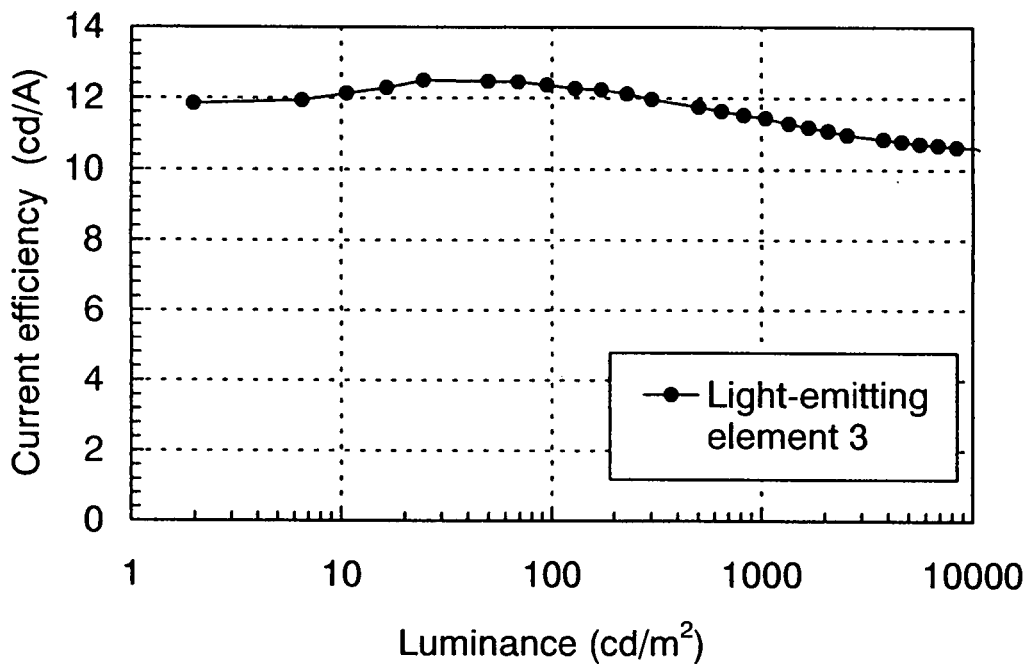
FIG. 17 is a graph showing a luminance-current efficiency characteristic of a light-emitting element manufactured in Embodiment 2.
Figure 18:
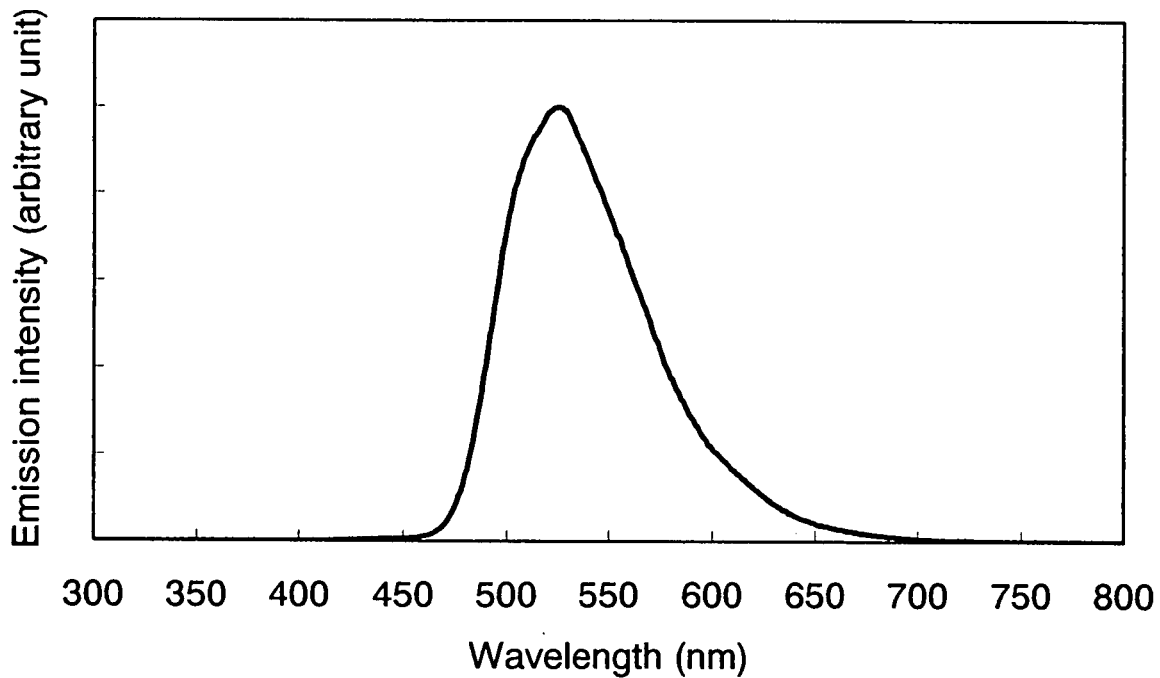
FIG. 18 is a graph showing an emission spectrum of a light-emitting element manufactured in Embodiment 2.

FIG. 15 shows a current density-luminance characteristic of the light-emitting element 3. FIG. 16 shows a voltage-luminance characteristic. FIG. 17 shows a luminance-current efficiency characteristic. FIG. 18 shows an emission spectrum when a current of 1 mA flows to the light-emitting element 3.

In the light-emitting element 3, the CIE chromaticity coordinates at luminance of 3000 cd/m² were (x, y)=(0.29, 0.62), and emission of green light was obtained. Current efficiency at luminance of 3000 cd/m² was 11.0 cd/A; voltage, 8.0 V; and current density, 28.3 mA/cm².

A continuous lighting test was performed on the light-emitting element 3 by constant current driving at an initial luminance of 3000 cd/m². Through the test, it was found that the light-emitting element 3 is a long-life light-emitting element with luminance of 90% of the initial luminance even after 640 hours have passed. On the other hand, a continuous lighting test was similarly performed on the comparative light-emitting element 4 at an initial luminance of 3000 cd/m². Through the test, it was found that the comparative light-emitting element 4 has luminance of 88% of the initial luminance after 470 hours have passed, which was the shorter life than that of the light-emitting element 3.

Accordingly, it was revealed that a long-life light-emitting element can be obtained by application of the present invention.

Embodiment 3

In this embodiment, a reduction reaction characteristic of tris(8-quinolinolato)aluminum(III) (abbreviation: Alq) and N,N'-diphenylquinacridone (abbreviation: DPQd), which were used for the second layer in each of the light-emitting element 1 and the light-emitting element 3 manufactured in Embodiment 1 and Embodiment 2, was examined by cyclic voltammetry (CV) measurement. Further, LUMO levels of Alq and DPQd were obtained from the measurement. The measurement was performed using an electrochemical analyzer (ALS model 600A, manufactured by BAS Inc.).

As for a solution used in the CV measurement, dehydrated dimethylformamide (DMF, manufactured by Aldrich, 99.8%, catalog number: 22705-6) was used as a solvent. Tetra-n-butylammonium perchlorate (n-Bu$_4$NClO$_4$, manufactured by Tokyo Chemical Industry Co., Ltd., catalog number: T0836), which was a supporting electrolyte, was dissolved in the solvent such that the concentration of the tetra-n-butylammonium perchlorate was 100 mmol/L. Moreover, the object to be measured was dissolved such that the concentration thereof was set to be 1 mmol/L. Further, a platinum electrode (a PTE platinum electrode, manufactured by BAS Inc.) was used as a work electrode. A platinum electrode (a VC-3 Pt counter electrode (5 cm), manufactured by BAS Inc.) was used as an auxiliary electrode. An Ag/Ag$^+$ electrode (an RE5 nonaqueous solvent reference electrode, manufactured by BAS Inc.) was used as a reference electrode. It is to be noted that the measurement was conducted at room temperature (20 to 25° C.).

(Calculation of Potential Energy of the Reference Electrode With Respect to a Vacuum Level)

First, potential energy (eV) of the reference electrode (Ag/Ag$^+$ electrode) used in Embodiment 3 with respect to a vacuum level was calculated. That is, a Fermi level of the Ag/Ag$^+$ electrode was calculated. It is known that an oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). On the other hand, an oxidation-reduction potential of ferrocene in methanol was obtained using the reference electrode used in Embodiment 3 was +0.20 V [vs. Ag/Ag$^+$]. Accordingly, it was found that potential energy of the reference electrode used in Embodiment 3 was lowered by 0.41 [eV] with respect to the standard hydrogen electrode.

Also, it is known that potential energy of the standard hydrogen electrode from a vacuum level is −4.44 eV (Reference: Toshihiro Ohnishi and Tamami Koyama, High molecular EL material, Kyoritsu shuppan, pp. 64-67). From the above, potential energy of the reference electrode used in Embodiment 3 with respect to a vacuum level was calculated such that −4.44−0.41=−4.85 [eV].

Measurement Example 1; Alq

Figure 19:
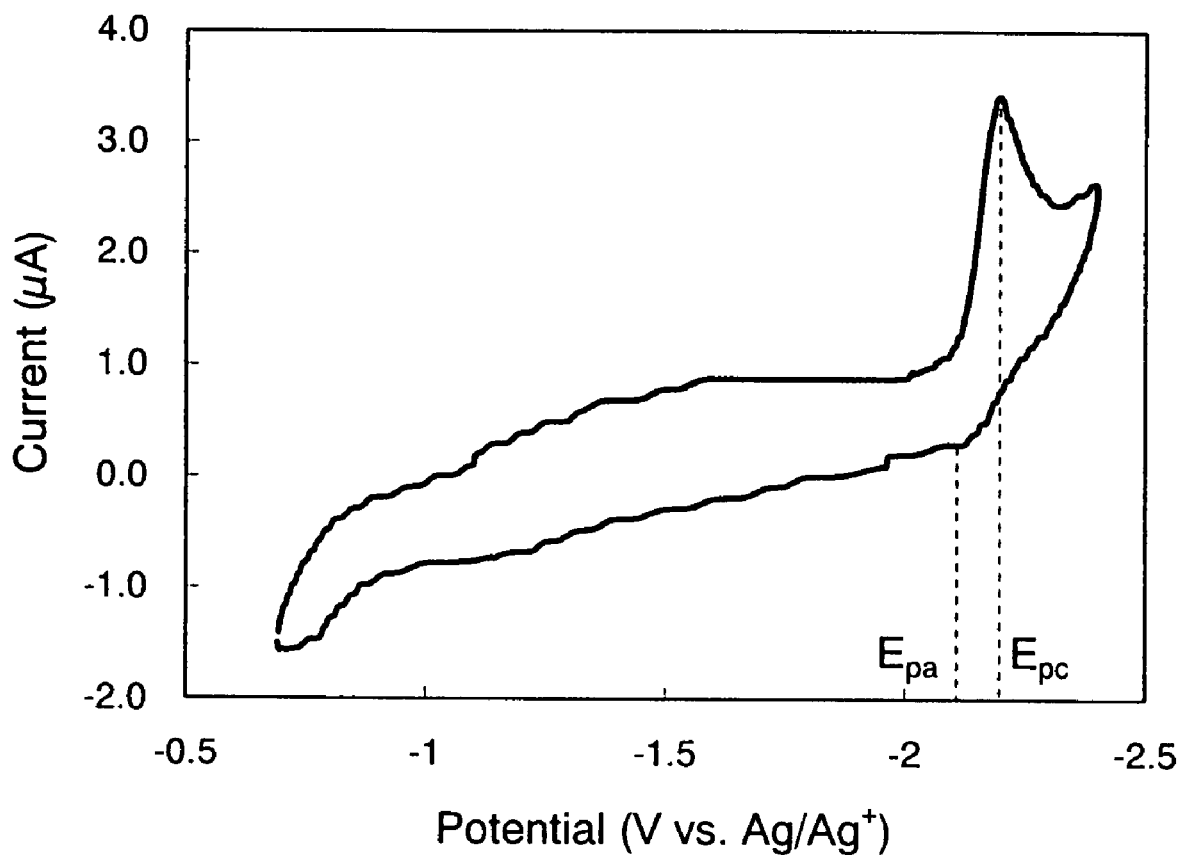
FIG. 19 is a graph showing a reduction reaction characteristic of Alq.

In Measurement Example 1, a reduction reaction characteristic of Alq was measured by cyclic voltammetry (CV) measurement. The scan speed was set to 0.1 V/sec. FIG. 19 shows a result of the measurement. In the measurement of the reduction reaction characteristic, a potential of a working electrode with respect to a reference electrode was changed from −0.69 V to −2.40 V, and then changed from −2.40 V to −0.69 V.

As is seen from FIG. 19, a reduction peak potential $E_{pc}$ is −2.20 V and an oxidation peak potential $E_{pa}$ is −2.12 V. Accordingly, a wave-half potential (an intermediate potential between $E_{pc}$ and $E_{pa}$) can be calculated to be −2.16 V. This shows that Alq is reduced by electrical energy of −2.16 [V vs. Ag/Ag$^+$], and this energy corresponds to a LUMO level. Here, as described above, potential energy of the reference electrode used in Embodiment 3 with respect to a vacuum level is −4.85 [eV]. Accordingly, it was found that a LUMO level of Alq was such that −4.85−(−2.16)=−2.69 [eV].

Measurement Example 2; DPQd

Figure 20:
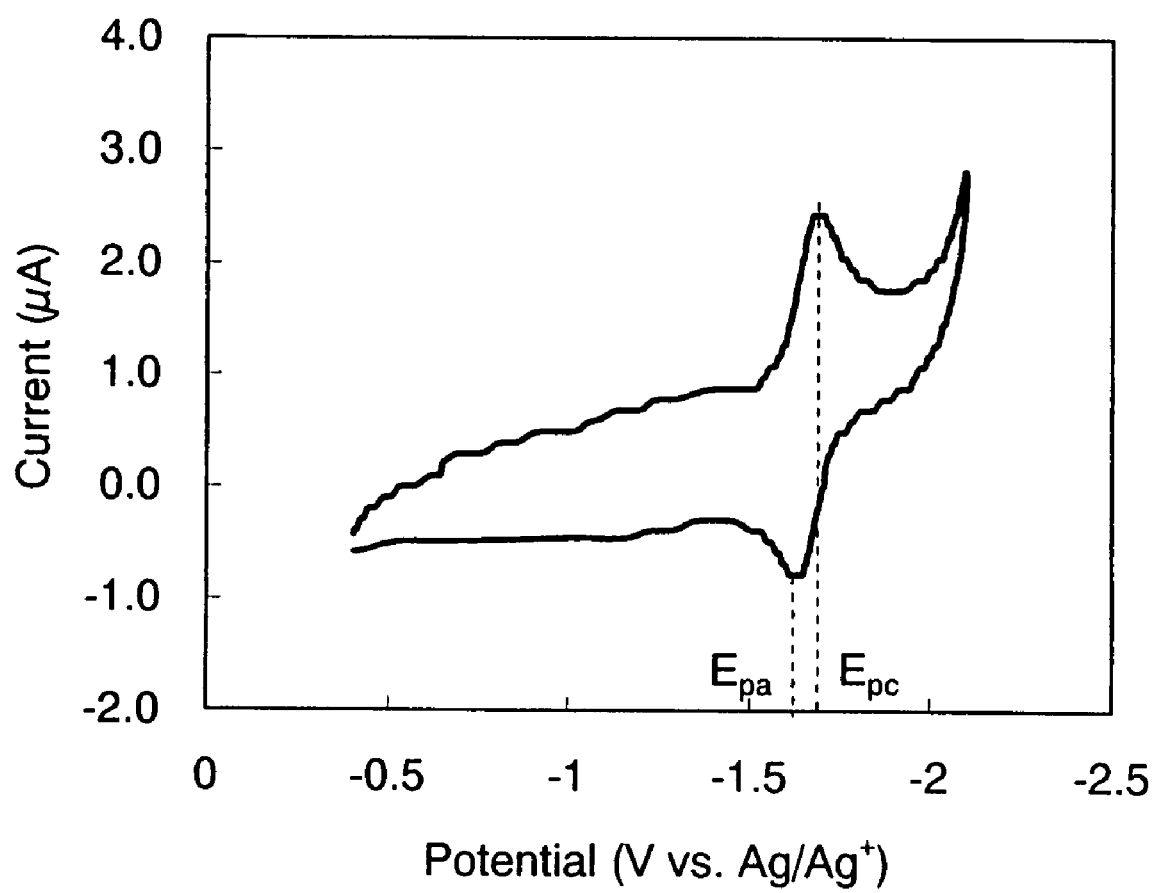
FIG. 20 is a graph showing a reduction reaction characteristic of DPQd.

In Measurement Example 2, a reduction reaction characteristic of DPQd was measured by cyclic voltammetry (CV) measurement. The scan speed was set to 0.1 V/sec. FIG. 20 shows a result of the measurement. In the measurement of the reduction reaction characteristic, a potential of a working electrode with respect to a reference electrode was changed from −0.40 V to −2.10 V, and then changed from −2.10 V to −0.40 V. Because DPQd has poor solubility, an undissolved residue of DPQd was generated in spite of preparation trial in which a solution is made to have the concentration of 1 mmol/L. Accordingly, in a state where the undissolved residue was precipitated, a supernatant solution was extracted and used for the measurement.

As is seen from FIG. 20, a reduction peak potential $E_{pc}$ is −1.69 V and an oxidation peak potential $E_{pa}$ is −1.63 V. Accordingly, a wave-half potential (an intermediate potential between $E_{pc}$ and $E_{pa}$) can be calculated to be −1.66 V. This shows that DPQd is chemically reduced by electrical energy of −1.66 [V vs. Ag/Ag$^+$], and this energy corresponds to a LUMO level. Here, as described above, potential energy of the reference electrode used in Embodiment 3 with respect to a vacuum level is −4.85 [eV]. Accordingly, it was found that a LUMO level of DPQd was such that −4.85−(−1.66)=−3.19 [eV].

When LUMO levels of Alq and DPQd obtained as described above are compared with each other, it is found that the LUMO level of DPQd is lower than that of Alq by 0.50 [eV]. This means that, by addition of DPQd to Alq, DPQd acts as an electron trap. Accordingly, the element structure of Embodiment 1 and Embodiment 2 is a preferred structure for the present invention, in which DPQd is used as the third organic compound and Alq is used as the fourth organic compound in the second layer of the light-emitting element of the present invention.

This application is based on Japanese Patent Application serial No. 2006-155 filed in Japan Patent Office on Jun. 2, 2006, the entire contents of which are hereby incorporated by reference.

What is claimed is:

1. A light-emitting element comprising:
   a first electrode and a second electrode;
   a first layer including first and second organic compounds, the first layer being formed between the first electrode and the second electrode wherein the first organic compound is capable of emitting a first light and the second organic compound has an electron transporting property;
   a second layer including third and fourth organic compounds, the second layer being formed between the first layer and the second electrode wherein the third organic compound is capable of emitting a second light and has an electron trap property and the fourth organic compound has an electron transporting property; and
   an electron transporting layer between the second layer and the second electrode,
   wherein the first layer is in contact with the second layer.

2. A light-emitting element according to claim 1, further comprising a hole transporting layer,
   wherein the first and second layers are provided between the electron transporting layer and the hole transporting layer.

3. A light-emitting element according to claim 1,
   wherein the first electrode and the second electrode are an anode and a cathode, respectively.

4. A lighting device comprising the light-emitting element according to claim 1.

5. An electronic device comprising:
   a display device,
   wherein the display device comprises the light-emitting element according to claim 1.

6. A light-emitting element according to claim 1,
   wherein a color of the first light is similar to a color of the second light.

7. A light-emitting element according to claim 1,
   wherein the third organic compound is a quinacridone derivative.

8. A light-emitting element according to claim 1,
   wherein the first organic compound is dispersed in the second organic compound in the first layer,
   wherein the third organic compound is dispersed in the fourth organic compound in the second layer, and
   wherein the second organic compound and the fourth organic compound are different from each other.

9. A light-emitting element comprising:
   a first electrode and a second electrode;
   a first layer including first and second organic compounds, the first layer being formed between the first electrode and the second electrode wherein the first organic compound is capable of emitting a first light and the second organic compound has an electron transporting property;
   a second layer including third and fourth organic compounds, the second layer being formed between the first layer and the second electrode wherein the third organic compound is capable of emitting a second light and the fourth organic compound has an electron transporting property; and
   an electron transporting layer between the second layer and the second electrode,
   wherein a lowest unoccupied molecular orbital level of the third organic compound is lower than a lowest unoccupied molecular orbital level of the fourth organic compound by 0.3 eV or more, and
   wherein the first layer is in contact with the second layer.

10. A light-emitting element according to claim 9, further comprising a hole transporting layer,
    wherein the hole transporting layer is formed between the first electrode and the first layer.

11. A light-emitting element according to claim 9,
    wherein the first electrode and the second electrode are an anode and a cathode, respectively.

12. A lighting device comprising the light-emitting element according to claim 9.

13. An electronic device comprising:
    a display device,
    wherein the display device comprises the light-emitting element according to claim 9.

14. A light-emitting element according to claim 9,
    wherein a color of the first light is similar to a color of the second light.

15. A light-emitting element according to claim 9,
    wherein the third organic compound is a quinacridone derivative.

16. A light-emitting element according to claim 9,
    wherein the first organic compound is dispersed in the second organic compound in the first layer,
    wherein the third organic compound is dispersed in the fourth organic compound in the second layer, and wherein the second organic compound and the fourth organic compound are different from each other.

17. A light-emitting element comprising:
a first electrode and a second electrode;
a first layer including first and second organic compounds, the first layer being formed between the first electrode and the second electrode wherein the first organic compound is capable of emitting a first light and the second organic compound has an electron transporting property;
a second layer including third and fourth organic compounds, the second layer being formed between the first layer and the second electrode wherein the third organic compound is capable of emitting a second light and the fourth organic compound has an electron transporting property; and
an electron transporting layer between the second layer and the second electrode,
wherein a lowest unoccupied molecular orbital level of the third organic compound is lower than a lowest unoccupied molecular orbital level of the fourth organic compound by 0.3 eV or more,
wherein a difference between a peak value of an emission spectrum of the first organic compound and a peak value of an emission spectrum of the third organic compound is 0 nm or more and less than 30 nm, and
wherein the first layer is in contact with the second layer.

18. A light-emitting element according to claim 17, further comprising a hole transporting layer,
wherein the hole transporting layer is formed between the first electrode and the first layer.

19. A light-emitting element according to claim 17,
wherein the first electrode and the second electrode are an anode and a cathode, respectively.

20. A lighting device comprising the light-emitting element according to claim 17.

21. An electronic device comprising:
a display device,
wherein the display device comprises the light-emitting element according to claim 17.

22. A light-emitting element according to claim 17,
wherein the third organic compound is a quinacridone derivative.

23. A light-emitting element according to claim 17,
wherein the first organic compound is dispersed in the second organic compound in the first layer,
wherein the third organic compound is dispersed in the fourth organic compound in the second layer, and
wherein the second organic compound and the fourth organic compound are different from each other.

24. A light-emitting element comprising:
a first electrode and a second electrode;
a first layer including first and second organic compounds, the first layer being formed between the first electrode and the second electrode wherein the first organic compound is capable of emitting a first light and the second organic compound has an electron transporting property;
a second layer including third and fourth organic compounds, the second layer being formed between the first layer and the second electrode wherein the third organic compound is capable of emitting a second light and has an electron trap property and the fourth organic compound has an electron transporting property and
an electron transporting layer between the second layer and the second electrode,
wherein a difference between a peak value of an emission spectrum of the first organic compound and a peak value of an emission spectrum of the third organic compound is 0 nm or more and less than 30 nm, and
wherein the first layer is in contact with the second layer.

25. A light-emitting element according to claim 24, further comprising a hole transporting layer,
wherein the first and second layers are provided between the electron transporting layer and the hole transporting layer.

26. A light-emitting element according to claim 24,
wherein the first electrode and the second electrode are an anode and a cathode, respectively.

27. A lighting device comprising the light-emitting element according to claim 24.

28. An electronic device comprising:
a display device,
wherein the display device comprises the light-emitting element according to claim 24.

29. A light-emitting element according to claim 24,
wherein the third organic compound is a quinacridone derivative.

30. A light-emitting element according to claim 24,
wherein the first organic compound is dispersed in the second organic compound in the first layer,
wherein the third organic compound is dispersed in the fourth organic compound in the second layer, and
wherein the second organic compound and the fourth organic compound are different from each other.

* * * * *